US007238435B2

(12) United States Patent
Kamatani et al.

(10) Patent No.: US 7,238,435 B2
(45) Date of Patent: Jul. 3, 2007

(54) POLYMERIC COMPOUND AND ORGANIC LUMINESCENCE DEVICE

(75) Inventors: Jun Kamatani, Kawasaki (JP); Shinjiro Okada, Isehara (JP); Akira Tsuboyama, Sagamihara (JP); Takao Takiguchi, Setagaya-Ku (JP); Satoshi Igawa, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/258,241

(22) PCT Filed: Aug. 30, 2002

(86) PCT No.: PCT/JP02/08804

§ 371 (c)(1),
(2), (4) Date: Oct. 22, 2002

(87) PCT Pub. No.: WO03/022908

PCT Pub. Date: Mar. 20, 2003

(65) Prior Publication Data

US 2003/0186080 A1 Oct. 2, 2003

(30) Foreign Application Priority Data

Sep. 4, 2001 (JP) ............................. 2001-267110
Sep. 4, 2001 (JP) ............................. 2001-267233

(51) Int. Cl.
H01L 51/54 (2006.01)
C09K 11/06 (2006.01)

(52) U.S. Cl. ................ 428/690; 428/917; 313/504; 528/395; 528/423; 257/40; 257/E51.028; 257/E51.032; 257/E51.036; 257/E51.044

(58) Field of Classification Search ................ 428/690, 428/917; 313/504, 506; 252/301.35; 257/40, 257/103; 526/90, 259, 265; 528/423
See application file for complete search history.

(56) References Cited

U.S. PATENT DOCUMENTS

| 5,281,489 | A | * | 1/1994 | Mori et al. ................ 428/690 |
| 5,442,021 | A | | 8/1995 | Heiliger ........................ 526/241 |
| 5,504,183 | A | * | 4/1996 | Shi et al. .................... 528/272 |
| 5,698,858 | A | | 12/1997 | Borner ...................... 250/484.2 |
| 6,696,180 | B2 | * | 2/2004 | Doi et al. ................... 428/690 |
| 6,869,693 | B2 | * | 3/2005 | Fryd et al. ................. 428/690 |
| 2001/0015432 | A1 | | 8/2001 | Igarashi ......................... 257/1 |
| 2002/0028349 | A1 | | 3/2002 | Seo ............................. 428/690 |
| 2002/0193532 | A1 | * | 12/2002 | Ikehira et al. ............. 525/333.3 |
| 2003/0148142 | A1 | | 8/2003 | Fryd et al. ................. 428/690 |
| 2004/0247934 | A1 | | 12/2004 | Takeuchi et al. ........... 428/690 |

FOREIGN PATENT DOCUMENTS

| EP | 1 138 746 | 10/2001 |
| EP | 1245659 | 10/2002 |
| JP | 5-78655 | 3/1993 |
| JP | 5-320633 | 12/1993 |
| JP | 8-319482 | 12/1996 |
| JP | 10-204426 | 8/1998 |
| JP | 11-256148 | 9/1999 |
| JP | 11-329739 | 11/1999 |
| JP | 2000-204364 | 7/2000 |
| JP | 2001-220579 | 8/2001 |
| JP | 2001-257076 | 9/2001 |
| JP | 2002-302671 | 10/2002 |
| WO | WO 02/31896 | 4/2002 |
| WO | WO 03/001616 | 1/2003 |

OTHER PUBLICATIONS

Machine-assisted translation of JP 10-204426 (Aug. 1998).*
U.S. Appl. No. 60/238,974 (filed Oct. 10, 2000).*
C. Lee, et al., "Polymer Electrophosphorescent Devices Using a Copolymer of $lr(ppy)_2$-Bound 2-(4-Vinylphenyl)pyridine with N-vinylcarbazole", 3rd Int'l Conf. on Electroluminescence of Molecular Materials and Related Phenomena, abstract No. 0-18, Los Angeles, California, Sep. 5-8, 2001.
S. Lamansky, et al., "Synthesis and Characterization of Phosphorescent Cyclometalated Iridium Complexes", Inorg. Chem., vol. 40, pp. 1704-1711 (2001), published on Web Mar. 1, 2001.
K.D. Ley, et al., "Photophysics of Metal-Organic π-Conjugated Polymers", Coordination Chem. Reviews, vol. 171, pp. 287-307 (1998), no month.
M.A. Baldo, et al., "Very High-Efficiency Green Organic Light-Emitting Devices Based on Electrophosphorescence", Appl. Phys. Lett., vol. 75, No. 1, pp. 4-6 (Jul. 5, 1999).
D.F. O'Brien, et al., "Improved Energy Transfer in Electrophosphorescent Devices", Appl. Phys. Lett., vol. 74, No. 3, pp. 442-444 (Jan. 18, 1999).

(Continued)

Primary Examiner—Marie Yamnitzky
(74) Attorney, Agent, or Firm—Fitzpatrick, Cella, Harper & Scinto

(57) ABSTRACT

A main chain-type or side chain-type polymeric compound having a structure wherein at least one metal complex segment having a plurality ligands is introduced into a main chain or a side chain is provided. In the case where the polymeric compound is the main chain-type polymeric compound, the metal complex segment has at least one ligand constituting a polymer main chain of the polymeric compound and having a carbon atom and oxygen atom bonded to a metal atom. On the other hand, in the case where the polymeric compound is the side chain-type polymeric compound, a polymer main chain thereof has a conjugated structure, preferably a conjugated double bond. A ligand for the polymeric compound includes a chain or cyclic ligand, of which a bidentate ligand having an organic cyclic structure is preferred, and the ligand has at least one carbon atom or oxygen atom and is bonded to a center metal atom, preferably iridium, via the carbon atom or oxygen atom. In a case of forming a luminescence layer by using the polymeric compound as a luminescent material, a resultant organic luminescence device is less liable to cause a concentration extinction and is a high-luminescence efficiency device excellent in stability.

7 Claims, 4 Drawing Sheets

OTHER PUBLICATIONS

C.H. Chen, et al., "Recent Developments in Molecular Organic Electroluminescent Materials", Macromol. Symp., vol. 125, pp. 1-48 (1997), no month.

P.S. Vincett, et al., "Electrical Conduction and Low Voltage Blue Electroluminescence in Vacuum-Deposited Organic Films", Thin Solid Films, vol. 94, pp. 171-183 (Aug. 13, 1982).

Wong et al., "Yellow Light Emitting . . . and Terpyridine Complexes" Advanced Materials, VCH, vol. 11, No. 6 (1999) pp. 455-459.

Wong et al., "Synthesis and Electronic Properties . . . 9-Butycarbazole Units"; Macromolecules, ACS, vol. 35, 2002 pp. 3506-3513, published on Web Mar. 19, 2002.

Ng, et al. "Quinoxaline-Based Conjugated Polymers . . . Metal Complex"; Macromolecular Rapid Communications, vol. 18, No. 12, 1997, pp. 1009-1016.

* cited by examiner (a)

(b)

(c)

POLYMERIC COMPOUND AND ORGANIC LUMINESCENCE DEVICE

TECHNICAL FIELD

The present invention relates to an organic luminescence device for use in a planar light source, a planar display, etc. (hereinafter also referred to as an "organic EL (electroluminescence) device"), and a polymeric compound used therefor.

The present invention particularly relates to a luminescence device using a polymeric compound having a metal complex segment, more specifically to a luminescence device exhibiting a high luminescence efficiency and less change with time by using a main chain or side chain-type polymeric compound having coordinate bond of a plurality of organic cyclic ligands with a metal, as a luminescent material. containing in its luminescence layer a luminescence material comprising a metal coordination compound less liable to cause concentration extinction even when used at a high concentration.

BACKGROUND ART

An old example of organic luminescence device is, e.g., one using luminescence of a vacuum-deposited anthracene film (Thin Solid Films, 94 (1982) 171). In recent years, however, in view of advantages, such as easiness of providing a large-area device compared with an inorganic luminescence device, and possibility of realizing desired luminescence colors by development of various new materials and drivability at low voltages, an extensive study thereon for device formation as a luminescence device of a high-speed responsiveness and a high efficiency, has been conducted.

As described in detail in, e.g., Macromol. Symp. 125, 1-48 (1997), an organic EL device generally has a structure comprising upper and lower two electrodes, and (a plurality of) organic compound layers including a luminescence layer between the electrodes formed on a transparent substrate.

For the luminescence layer, aluminum guinolynol complexes (a representative example thereof is Alq3 shown hereinafter), etc., having an electron-transporting characteristic and luminescence characteristic are used. For a hole-transporting layer, e.g., biphenyldiamine derivatives (a representative example thereof is α-NPD shown hereinafter), etc., having an electron-donative characteristic are used.

These devices have a rectifying characteristic, and when an electric field is applied between electrodes, electrons are injected from a cathode into the luminescence layer and holes are injected from an anode.

The injected holes and electrons are recombined within the luminescence layer to form excitons and cause luminescence when transferred to the ground state.

In this process, an excited state includes an excited singlet state and an excited triplet state, and the transition from the former state to the ground state is called "fluorescence" and the transition from the latter state to the ground state is called "phosphorescence". And the substances in these excited states are called a singlet exciton and a triplet exciton, respectively.

In most of the organic luminescence devices studied heretofore, fluorescence caused by the transition from the excited singlet state to the ground state, has been utilized. On the other hand, in recent years, devices utilizing phosphorescence via triplet excitons have been studied.

Representative published literature may include:

Article 1: Improved energy transfer in electrophosphorescent device (D. F. O'Brien, et al., Applied Physics Letters, Vol. 74, No. 3, p. 422 (1999)); and Article 2: Very high-efficiency green organic light-emitting devices based on electrophosphorescence (M. A. Baldo, et al., Applied Physics Letters, Vol. 75, No. 1, p. 4 (1999)).

In these articles, a structure including 4 lamination layers as organic layers sandwiched between electrodes has been principally used. Materials used therein include carrier-transporting materials and phosphorescent materials. Abbreviations for the respective materials are as follows.

Alq3: aluminum quinolinol complex
α-NPD: N4,N4'-di-naphthalene-1-yl-N4,N4'-diphenyl-biphenyl-4,4'-diamine
CBP: 4,4'-N,N'-dicarbazole-biphenyl
BCP: 2,9-dimethyl-4,7-diphenyl-1,10-phenanthroline
PtOEP: platinum-octaethylporphyrin complex
Ir(ppy)3: iridium-phenylpyrimidine complex

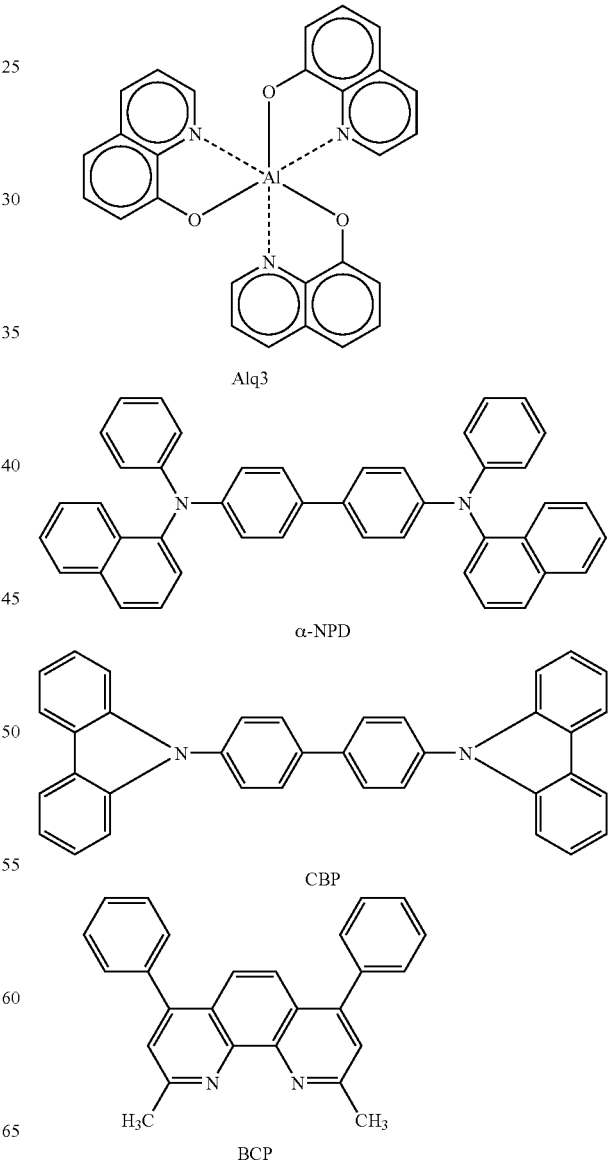

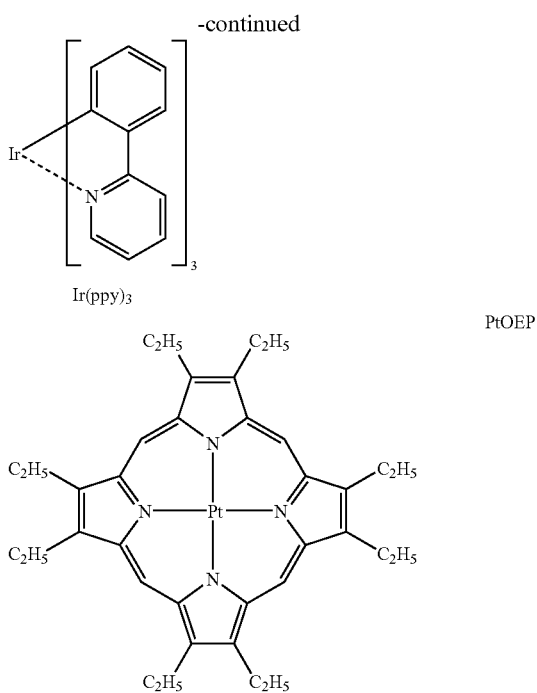

Ir(ppy)₃

PtOEP

The above-mentioned Articles 1 and 2 both have reported devices exhibiting a high efficiency, including a hole-transporting layer comprising α-NPD, an electron-transporting layer comprising Alq3, an exciton diffusion-preventing layer comprising BCP, and a luminescence layer comprising CBP as a host material and ca. 6% of PtOEP or Ir(ppy)₃ as a phosphorescent material dispersed in mixture therein.

Such a phosphorescent material is particularly noted at present because it is expected to provide a high luminescence efficiency in principle for the following reasons.

Excitons formed by carrier recombination comprise singlet excitons and triplet excitons in a probability ratio of 1:3. Conventional organic EL devices have utilized fluorescence of which the luminescence efficiency is limited to at most 25%, which has been an upper limit. However, if phosphorescence generated from triplet excitons is utilized, an efficiency of at least three times is expected in principle, and even an efficiency of 100%, i.e., four times, can be expected in principle, if a transition owing to intersystem crossing from a singlet state having a higher energy to a triplet state is taken into account.

Articles describing luminescence from the triplet state may include Japanese Laid-Open Patent Application (JP-A) 11-329739 (organic EL device and production process thereof), JP-A 11-256148 (luminescent material and organic EL device using the same), and JP-A 8-319482 (organic electroluminescent device).

However, like a fluorescent-type device, such an organic luminescence device utilizing above-mentioned phosphorescence is generally required to be further improved regarding the deterioration of luminescence efficiency and device stability.

The reason of the deterioration has not been fully clarified, but the present inventors consider deterioration occurs based on the mechanism of phosphorescence.

In the case where the organic luminescence layer comprises a host material having a carrier-transporting function and a phosphorescent guest material, a main process of phosphorescence via triplet excitons may include unit processes as follows:

1. transportation of electrons and holes within a luminescence layer,
2. formation of host excitons,
3. excitation energy transfer between host molecules,
4. excitation energy transfer from the host to the guest,
5. formation of guest triplet excitons, and
    6. transition of the guest triplet excitons to the ground state and phosphorescence.

Desirable energy transfer in each unit process and luminescence are caused in competition with various energy deactivation processes.

Needless to say, a luminescence efficiency of an organic luminescence device is increased by increasing the luminescence quantum yield of a luminescence center material, but it is also an important factor to increase its concentration. However, if the the concentration of luminescent excitons is too high, the luminescence intensity is rather lowered as also disclosed in JP-A 05-078655 or JP-A 05-320633. This phenomenon is known as concentration extinction or concentration deactivation. The reason for the phenomenon may be associated with radiationless transition with no luminescence due to progress of polymer formation reaction between luminescence center material molecules or those and their surrounding material molecules, as the above-mentioned competition reaction. Accordingly, it has been known that there is an appropriate concentration as a spatial density of luminescence excitons for improving a luminescence efficiency, irrespective of fluorescent material or phosphorescent material.

According to Article 3: Photophysics of metal-organic π-conjugated polymers, K. D. Ley et al., Coordination Chemistry Reviews 171 (1998), pp. 287-307, using a main chain-type polymeric compound comprising a metal complex segment, as a luminescent material, as a part of a main chain; photoluminescence is measured by using the following compound and application thereof to an organic luminescence device is also suggested.

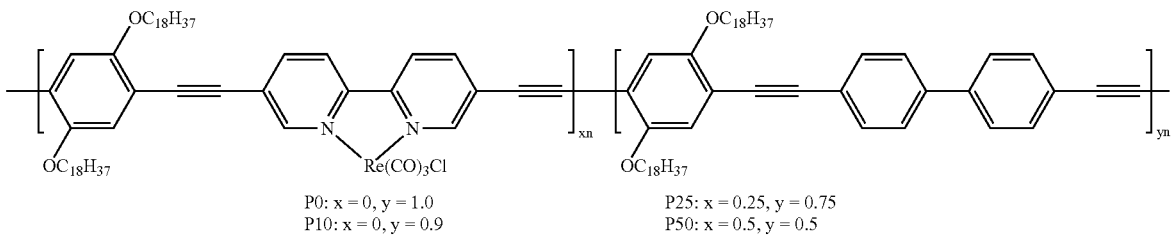

P0: x = 0, y = 1.0
P10: x = 0, y = 0.9

P25: x = 0.25, y = 0.75
P50: x = 0.5, y = 0.5

However, according to experience of the present inventors, the above-mentioned main chain-type polymeric compound has an unstable C=O bond contained in Re complex, thus being considered to be lacking in stability as a compound. Further, the polymeric compound contains a polymer main chain including triple bond, thus also being considered to be lacking in photostability.

On the other hand, an embodiment using a side chain-type polymeric compound, represented by a formula shown below, having a metal complex segment in a polymer side chain as a phosphorescent material has been described in Article 4: Polymer electro-phosphorescent devices using a copolymer of Ir(ppy)$_2$-bound 2-(4-Vinylphenyl)pyridine with N-vinylcarbazole, Change-Lyoul Lee et al., 3rd International Conference on Electroluminescence of Molecular materials and Related Phenomena, Program and Abstracts, 0-18, Sep., 5-8, 2001.

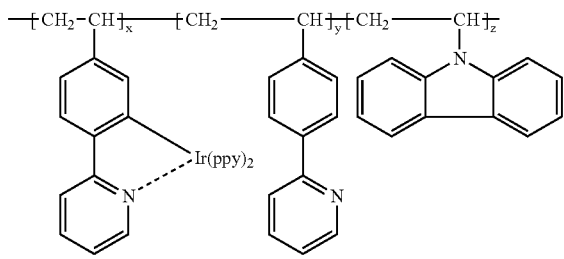

However, when a metal complex segment is introduced into a polymeric compound skeleton in the case where the metal complex segment has a conjugated structure, a conjugated (structure) proportion in the polymeric compound can readily be finally increased by constituting the polymer main chain skeleton with the conjugated structure rather than the case of having the metal complex segment in the side chain. By having a higher conjugated proportion in the polymeric compound, a higher electroconductivity is liable to be attained, thus allowing a preparation of a device possessing a high luminescence efficiency.

DISCLOSURE OF INVENTION

An object of the present invention is to provide a novel phosphorescent polymeric compound having a metal complex segment and an organic luminescence device using the polymeric compound of a high efficiency and a good stability.

In order to accomplish the above object, the present invention provides a polymeric compound of a main chain-type or a side chain-type comprising at least one metal complex segment in a main chain or a side chain, wherein the main chain-type polymeric compound has a polymer main chain comprising a ligand of the metal complex segment, said ligand having a carbon atom or oxygen atom bonded to a metal atom, and the side chain-type polymeric compound has a polymer main chain having a conjugated structure.

Further, the present invention provides an organic luminescence device comprising a pair of electrodes disposed on a substrate, and a luminescence layer disposed therebetween comprising at least one organic compound, wherein the organic compound is the above-mentioned polymeric compound.

The polymeric compound of the present invention includes the main chain-type polymeric compound and the side chain-type polymeric compound as described above, and the former is characterized in that at least one of a plurality of ligands contained in its metal complex segment constitutes a polymer main chain that said at least one ligand has a carbon atom or an oxygen atom bonded to a metal atom of the metal complex segment and, the latter is characterized in that its metal complex segment is directly or indirectly bonded to a polymer main chain.

In the main chain-type polymeric compound, as the ligand constituting the polymer main chain, it is preferred to use an organic cyclic ligand but a linear ligand may be used.

The side chain-type polymeric compound has the conjugated structure in its main chain skeleton, and the conjugated structure may preferably be a conjugated double bond. On the other hand, also in the case of the main chain-type polymeric compound, it is preferred to have the conjugated structure but the conjugated structure may be omitted.

The plurality of ligands contained in the polymeric compound of the present invention means molecules, ions or atoms which are mutually independently bonded to a center metal atom of the metal complex segment but may preferably be an organic cyclic ligand. The organic cyclic ligand may preferably be a multidentate ligand, particularly a bidentate ligand.

The present inventors have found that the concentration extinction or the formation of excited polymer is suppressed by fixing a phosphorescent center material within the main chain-type or side chain-type polymeric compound at an appropriate concentration, thus realizing an increase in luminescence efficiency of the resultant device.

BEST MODE FOR PRACTICING THE INVENTION

Basic device structures according to the present invention are shown in FIGS. 1(a), (b) and (c).

Figure 1:
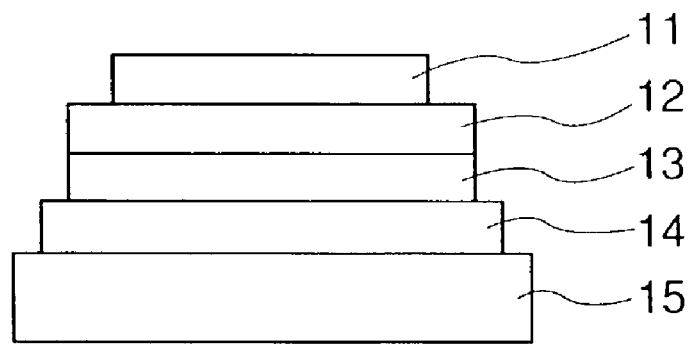
FIG. 1 includes schematic sectional views showing structures of the organic luminescence device according to the present invention, including: (a) the case of 2-layered structure of organic film layers; (b) the case of 3-layered structure of organic film layers; and (c) the case of 4-layered structure of organic film layers.
Figure 1:
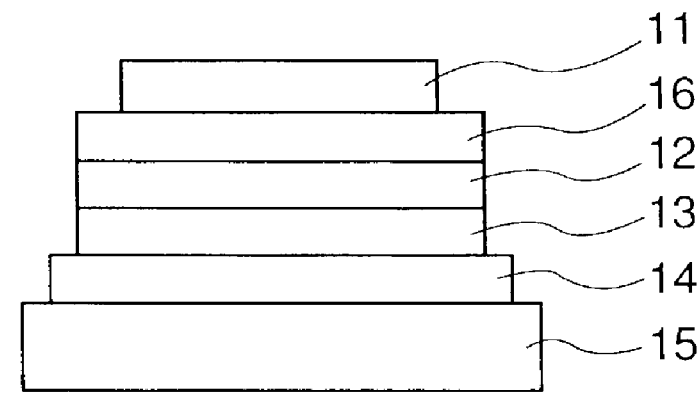
Figure 1:
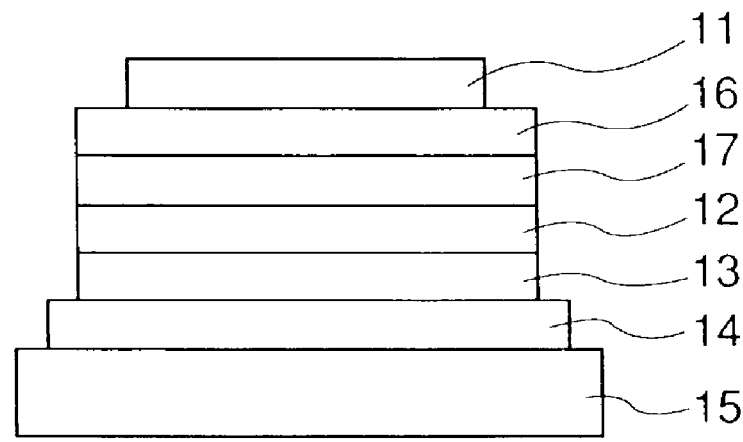

As shown in FIG. 1, an organic luminescence device generally comprises, on a transparent substrate 15, a 50 to 200 nm-thick transparent electrode 14, a plurality of organic film layers, and a metal electrode 11 formed so as to sandwich the organic layers.

FIG. 1(a) shows an embodiment wherein the organic layers comprise a luminescence layer 12 and a hole-transporting layer 13. The transparent electrode 14 may comprise ITO, etc., having a large work function so as to facilitate hole injection from the transparent electrode 14 to the hole-transporting layer 13. The metal electrode 11 comprises a metal material having a small work function, such as aluminum, magnesium or alloys of these elements, so as to facilitate electron injection into the organic layer(s).

The luminescence layer 12 comprises the polymeric compound according to the present invention. The hole-transporting layer 13 may comprise, e.g., a triphenyldiamine derivative, as represented by α-NPD mentioned above, and also a material having an electron-donative property as desired.

A device organized above exhibits a current-rectifying characteristic, and when an electric field is applied between the metal electrode 11 as a cathode and the transparent electrode 14 as an anode, electrons are injected from the metal electrode 11 into the luminescence layer 12, and holes are injected from the transparent electrode 15. The injected holes and electrons are recombined in the luminescence layer 12 to form excitons, which cause luminescence. In this instance, the hole-transporting layer 13 functions as an electron-blocking layer to increase the recombination efficiency at the boundary between the luminescence layer layer 12 and the hole-transporting layer 13, thereby providing an enhanced luminescence efficiency.

Further, in the device of FIG. 1(b), an electron-transporting layer 16 is disposed between the metal electrode 11 and the luminescence layer 12 in FIG. 1(a). As a result, the luminescence function is separated from the functions of election transportation and hole transportation to provide a structure exhibiting more effective carrier blocking, thus increasing the luminescence efficiency. The electron-transporting layer 16 may comprise, e.g., an oxadiazole derivative.

As shown in FIG. 1(c), a four-layer structure, including a hole-transporting layer 13, a luminescence layer 12, an exciton diffusion prevention layer 17 and an electron-transporting layer 16, successively from the side of the transparent electrode 14 as an anode, is also a desirable form.

The PC of the present invention refers to a compound having a number-average molecular weight (Mn) of at least 2,000 and has at least one metal complex segment in its molecule constituting a polymer main chain or directly or indirectly bonded to a polymer main chain and also emits phosphorescence. Its lowest excited state is believed to be an MLCT* (metal-to-ligand charge transfer) excited state or π-π* excited state in a triplet state, and phosphorescence is caused at the time of transition from such an excited state to the ground state.

The polymeric compound of the present invention exhibited a high phosphorescence yield of from 0.15 to 0.9 and a short phosphorescence life of 0.1-100 μsec.

If the phosphorescence life is too long, an energy saturation state is caused to occur thereby to remarkably lowering luminescence efficiency. Long phosphorescence life is not desired in a luminescence device. Further, abundant presence of molecules in a triplet excited state awaiting luminescence is therefore subject to various competition reactions as described above, thus leading to a reduction in luminescence efficiency. Particularly, there arises a problem of a lowering in luminescence efficiency when a current passing through a device has a high density.

The present invention is characterized by a luminescent material for the organic EL device exhibiting properties such that the above-mentioned concentration extinction is minimized to provide stable luminescence and to provide a high phosphorescence yield and a relatively short phosphorescence life in a temperature range of −20 C. to (+) 60° C. being a practical operation temperature of the organic luminescence device. The luminescence material is provided by fixing a phosphorescent material in a polymer in a form of a metal complex segment at a certain proportion.

Further, this polymeric material has various emission wavelengths depending on a difference in structure of the metal complex segment, so that it becomes possible to provide a material having a broad emission wavelength and allow preparation of a device exhibiting a good luminescent characteristic by incorporating a plurality of metal complex segments including ligands or metal atoms different in structure into a polymer main chain. For this reason, the polymeric compound of the present invention may preferably be a copolymer.

Examples of the center metal atom contained in a metal complex segment of the polymeric compound of the present invention may include, e.g., platinum (Pt), rhodium (Rh), ruthenium (Ru), iridium (Ir), osmium (Os), gold (Au), palladium (Pd), copper (Cu), and cobalt (Co), preferably platinum (Pt), rhodium (Rh), ruthenium (Ru) and iridium (Ir), particularly preferably iridium (Ir). The center metal atom may preferably bonded to at least one carbon atom or oxygen atom contained in each ligand.

Specific examples of the ligand constituting the metal complex segment may preferably include those shown below, such as phenylpyridine, thienylpyridine, phenylisoquinoline, acetylacetone, picolinic acid, derivatives having these skeletons, derivatives having a phenyl group skeleton, and derivatives having a pyridine skeleton. Incidentally, hydrogen atom in each structural formula may be substituted with another atom or group. Further, non-bonding linkage indicates methyl group.

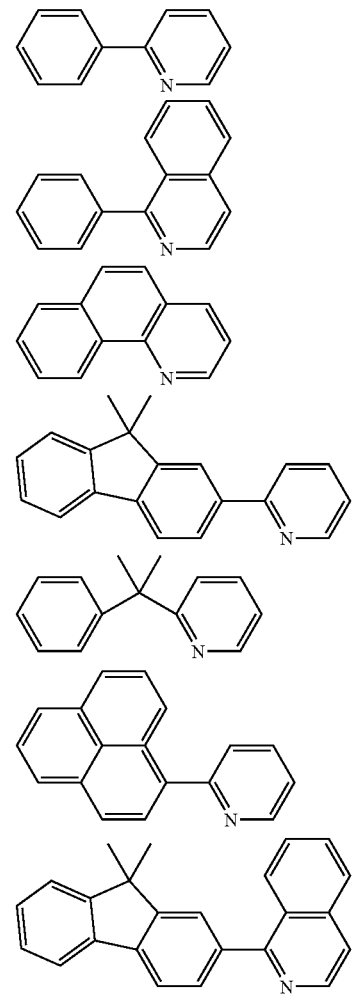

-continued

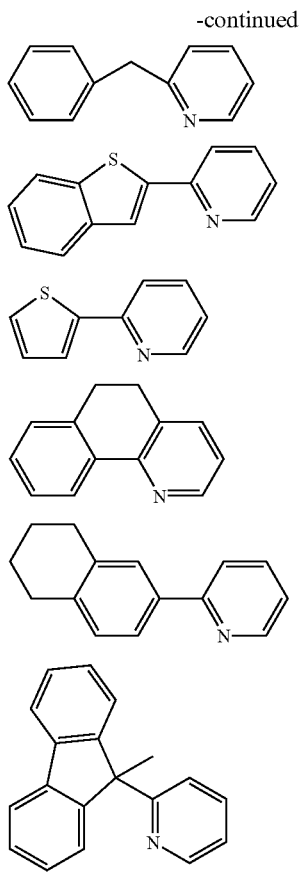

-continued

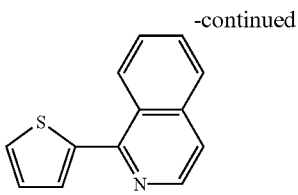

Further, in the present invention, it is also possible to use, e.g., a polymeric compound having a plurality of different metal complex segments by appropriately changing the species and the number of metal atom(s) and ligands constituting the metal complex segment. Alternatively, it is also possible to use at least one another compound in mixture with the polymeric compound of the present invention.

Further, the polymeric compound of the present invention can be in a mixture of plural species with a compound ordinarily used as a carrier transport layer, thus allowing preparation of a device having a broad emission wavelength or a device of a higher luminescence efficiency. Further, it is also possible to provide improved film-forming properties such as prevention of precipitation of a crystal at the time of device preparation.

Of the above-mentioned polymer compounds, examples may include those shown below including: PPV (polyparaphenylene-vinlene) and its derivatives such as RO-PPV, CN-PPV, DMOS-PPV and MEH-PPV; PAT (polyalkylthiophene) and its derivatives such as PEDOT, PCHMT, POPT, PTOPT, PDCHT and PCHT; PPP and its derivatives such as RO-PPP and FP-PPP; PDAF (polydialkylfluorenone); PVK (polyvinyl-carbazole); polyacetylene derivatives such as PPA, PDPA and PAPA; polysilane-based sigma (δ)-conjugation system polymers such as PDBS, PDHS, PMPS and PBPS; polysilol and triphenylamine-based polymers such as TPDPES and TPDPEK.

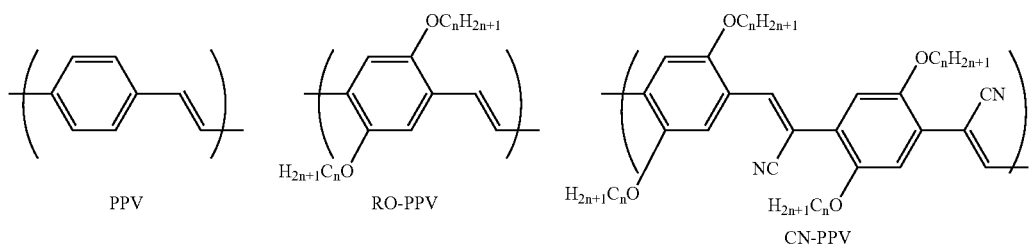

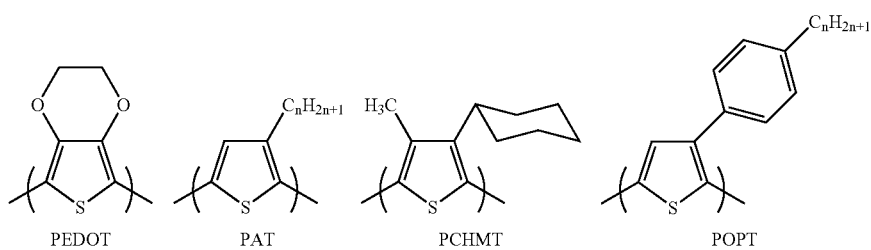

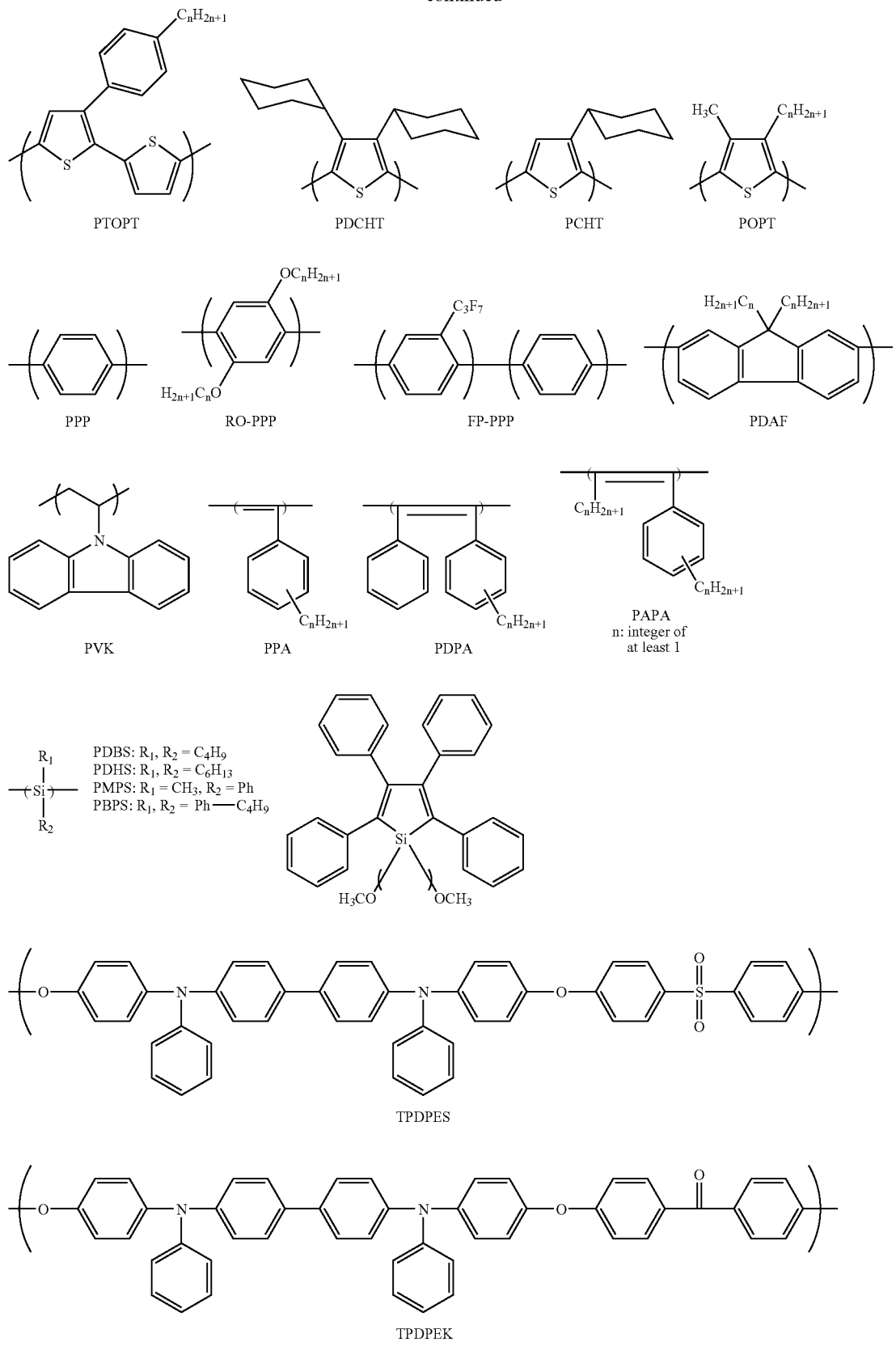

Next, the polymeric compound of the present invention is roughly classified into two types as described above including:

1) main chain-type polymeric compound (the case where a ligand of a metal complex segment is directly introduced into a polymer main chain), and
2) side chain-type polymeric compound (the case where a metal complex segment is directly or directly bonded to a polymer main chain).

First, the main chain-type polymeric compound of 1) will be described. Its synthesis method may be roughly classified into two processes shown below for:

a) polymer reaction-type polymeric compound, and
b) metal complex monomer-type polymeric compound.

Further, similar processes may also be adopted when a compound containing a plurality of metal complex segments at the same time is prepared.

Hereinbelow, general synthesis examples of the objective main chain-type polymeric compound in the present invention are shown below. Hereinafter, A, B and C respectively represent a monomer or divalent organic group having no coordination site; L represents a coordination atom or group; and M represents a metal ion or metal complex. Incidentally, A, B and C may b omitted, and an entire polymer main chain may be constituted by L.

a) Polymer reaction-type polymeric compound

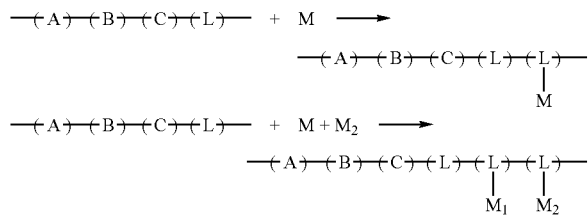

b) Metal complex monomer-type polymeric compound

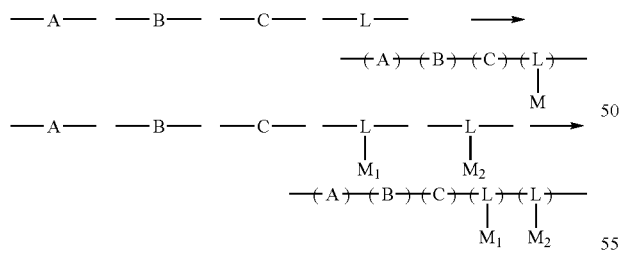

Then, the side chain-type of 2) will be described. Examples of a general formula of the side chain-type polymeric compound of the present invention are shown below. Further, the polymeric compound of the present invention may be prepared through a copolymerization with another polymeric compound precursor. A main chain of the polymeric compound is represented by $-(X)_n-(Y)_m-$ segment in the following formula, and a side chain of the polymeric compound is represented by $-Z-L_1-M-L_2(L_3)$ segment.

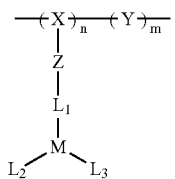

In the formula, X is an electroconductive group such as vinylene, phenylene, phenylenevinylene or thiophene. Y may desirably be a polymer unit having an electroconductive group such as phenylenevinylene, thiophene or fluorene but may be a single bond. Further, Y does not have a side chain. Although Z is not particularly limited, Z may be an alkylene group such as methylene or ethylene, an aromatic group such as phenylene, a combination of these groups, or a single bond. M is a center metal and may be selected from the group consisting of platinum (Pt), rhodium (Rh), ruthenium (Ru), iridium (Ir), osmium (Os), gold (Au), palladium (Pd), copper (Cu), and cobalt (Co), and, particularly, may be platinum, rhodium, ruthenium or iridium. $L_1$ represents a group having at least a carbon-metal coordination bond or oxygen-metal coordination bond, and examples thereof may include the above-mentioned ligands; picolinic acid; derivatives having these skeletons; derivatives having a phenyl group skeleton; derivatives having pyridine skeleton; and β-diketones. Although $L_2$ and $L_3$ are not particularly limited, $L_2$ and $L_3$ may desirably be a bidentate ligand, such as the above-mentioned ligands; picolinic acid; derivatives having these skeletons; derivatives having a phenyl skeleton; derivatives having pyridine skeletons; and β-diketones. In the case where the metal has a coordination number of 4, $L_3$ may be omitted. Further, $L_2$ and $L_3$ may be the same group or different groups. The letters m and n represent a polymerization degree and may be determined appropriately in view of a luminescence efficiency or an electroconductivity, with the proviso that n is not 0.

Further, as shown in the following general formula, the side chain-type polymeric compound may contain a plurality of metal atoms or ligands in its molecule. In the following formula, a main chain of the polymeric compound of the present invention is represented by $-(X1)_k-(X2)_l-$ segment, and a side chain is represented by $-Z_1-L_{11}-M_1-L_{12}(L_{13})$ and $-Z_2-L_{21}-M_2-L_{22}(L_2)$.

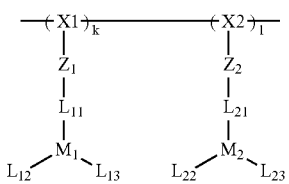

In the above general formula, X1 and X2 correspond to X described above, $Z_1$ and $Z_2$ correspond to Z described above, $M_1$ and $M_2$ correspond to M described above, $L_{11}$ and $L_{12}$ correspond to $L_1$ described above, $L_{12}$ and $L_{22}$ correspond to $L_2$ described above, $L_{13}$ and $L_{23}$ correspond to $L_3$ described above, and k and 1 correspond to m and n described above, respectively.

In the case where the above-mentioned main chain-type and side chain-type polymer compounds are synthesized, structures of reaction products are not restricted to the general formulas described above because bonding to the above-mentioned monomers or metal complex segments may be expected to assume various bonding (linkage) manners. For example, it is also considered that a metal atom is bonded or linked to a ligand constituting another recurring unit, or a crosslinked structure is formed between plural molecules. Similarly, the polymerization degree varies depending on production conditions, so that it is also possible to change a resultant number-average molecular weight from several thousands to several millions.

However, in view of preparation of the organic luminescence device, it is necessary to form a luminescence layer comprising the polymeric compound on a substrate. In this instance, if the molecular weight is too small, wettability at the time of (wet-)coating is undesirably liable to be impaired or peeling of film is undesirably liable to occur after the coating. On the other hand, if the molecular weight exceeds a million, the polymeric compound is not readily dissolved in a solvent used in the coating step to be precipitated, or an excessively high viscosity of a solution impairs a coating performance in some cases.

Accordingly, the polymeric compound of the present invention may generally preferably have a number-average molecular weight of 2,000-1,000,000, and may readily be treated as a compound. A further preferred range is from 3,000 to 100,000.

Further, the polymeric compound of the present invention can be used together or in mixture with another polymeric compound. Such another polymeric compound preferably include a compound similar to the polymeric compound of the present invention, a polymeric compound having a carrier-transporting performance, such as PVK or PPV as described above, and a polymeric compound capable of improving film-forming properties. Such another polymeric compound may be used in mixture with the polymeric compound of the present invention to form a single layer or used together with the polymeric compound of the present invention for separate layers in lamination.

Synthesis schemes of the main chain-type and side chain-type polymeric compounds of the present invention will be specifically shown below by taking those for iridium coordination-polymeric compound as an example.

Main Cain-type Polymeric Compound

A synthesis process of the polymeric compound having a polymer main chain into which a ligand of a metal complex segment is introduced may include a process wherein the polymer main chain is formed in advance and is reacted with a metal complex and a process wherein a polymer precursor to which a metal complex is bonded is subjected to a copolymerization with monomer(s).

SYNTHESIS EXAMPLE 1

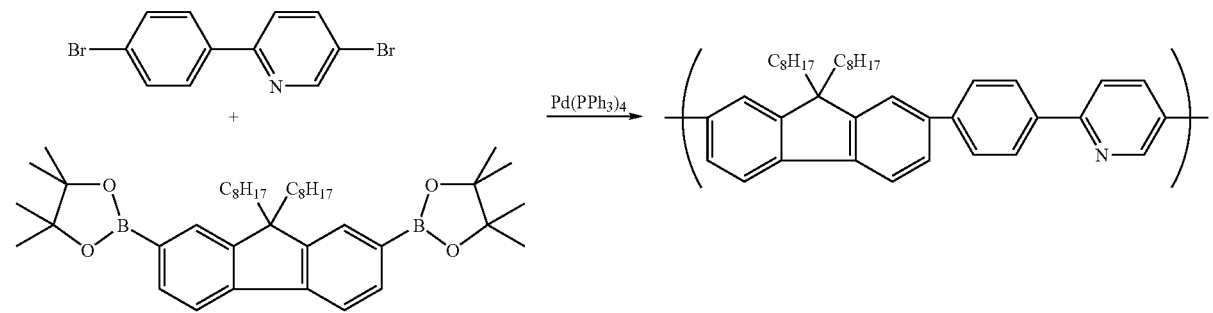

Pd(PPh$_3$)$_4$: tetrakis(triphenylphosphine)palladium

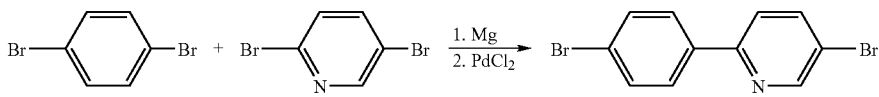

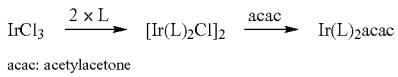

acac: acetylacetone

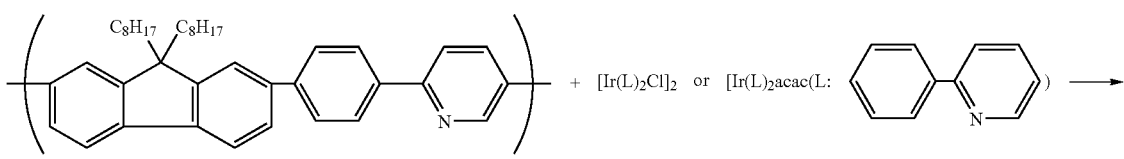

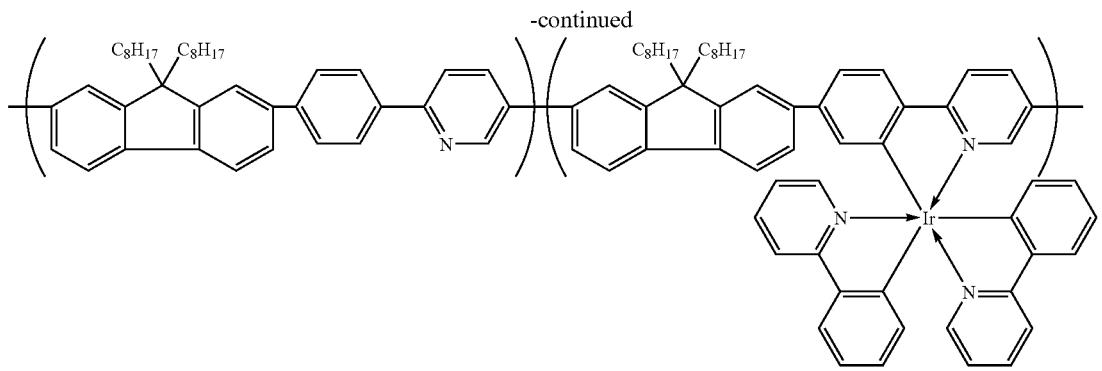

When the final compound is viewed with respect to Ir metal as a center, the Ir metal is directly bonded to an nitrogen atom of a pyridine ring and a carbon atom of a benzene ring, in a bidentate ligand constituting a polymer main chain. Further, the Ir metal is found to be similarly bonded to a pyridine ring and a benzene ring of each of the two bidentate ligands.

(In the above equation, a ratio between two recurring units depends on concentrations of [Ir(L)$_2$Cl$_2$] or Ir(L)$_2$acac and reaction conditions, so that it is possible to control a recurring manner of the two recurring units.)

SYNTHESIS EXAMPLE 2

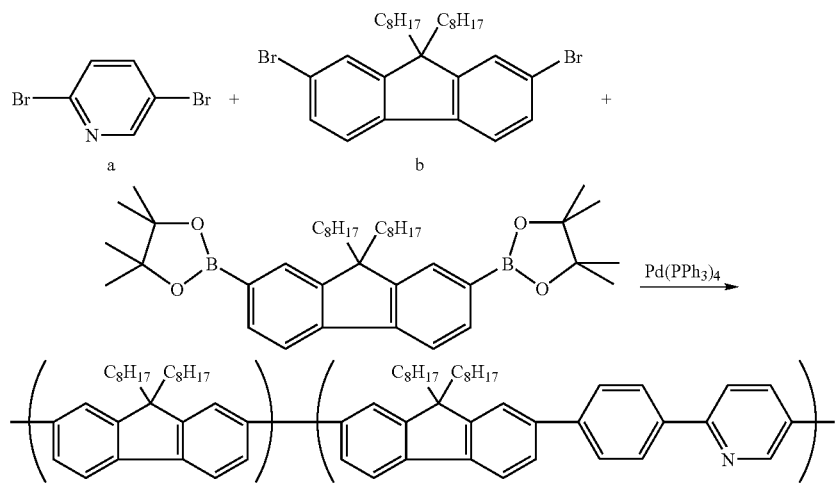

(In the above equation, a ratio between two recurring units depends on concentrations of monomers a and b during the reaction and reaction conditions, so that it is possible to control a recurring manner of the two recurring units.)

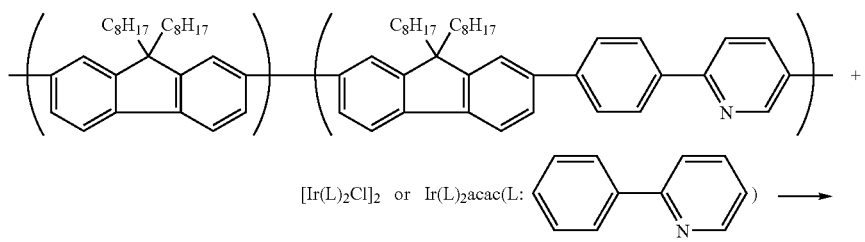

-continued

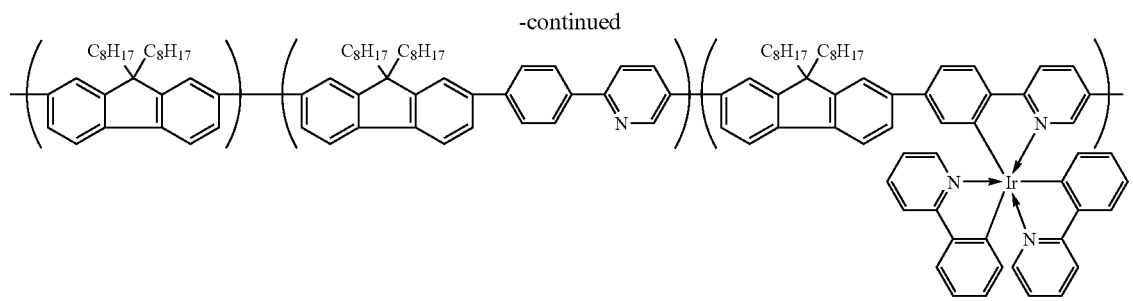

(In the above equation, a ratio among three recurring units depends on starting materials, concentrations of [Ir(L)$_2$Cl$_2$] or Ir(L)$_2$acac used in the reaction and reaction conditions, so that it is possible to control a recurring manner of the two recurring units. A similar situation is held with respect to the following compound examples.

SYNTHESIS EXAMPLE 3

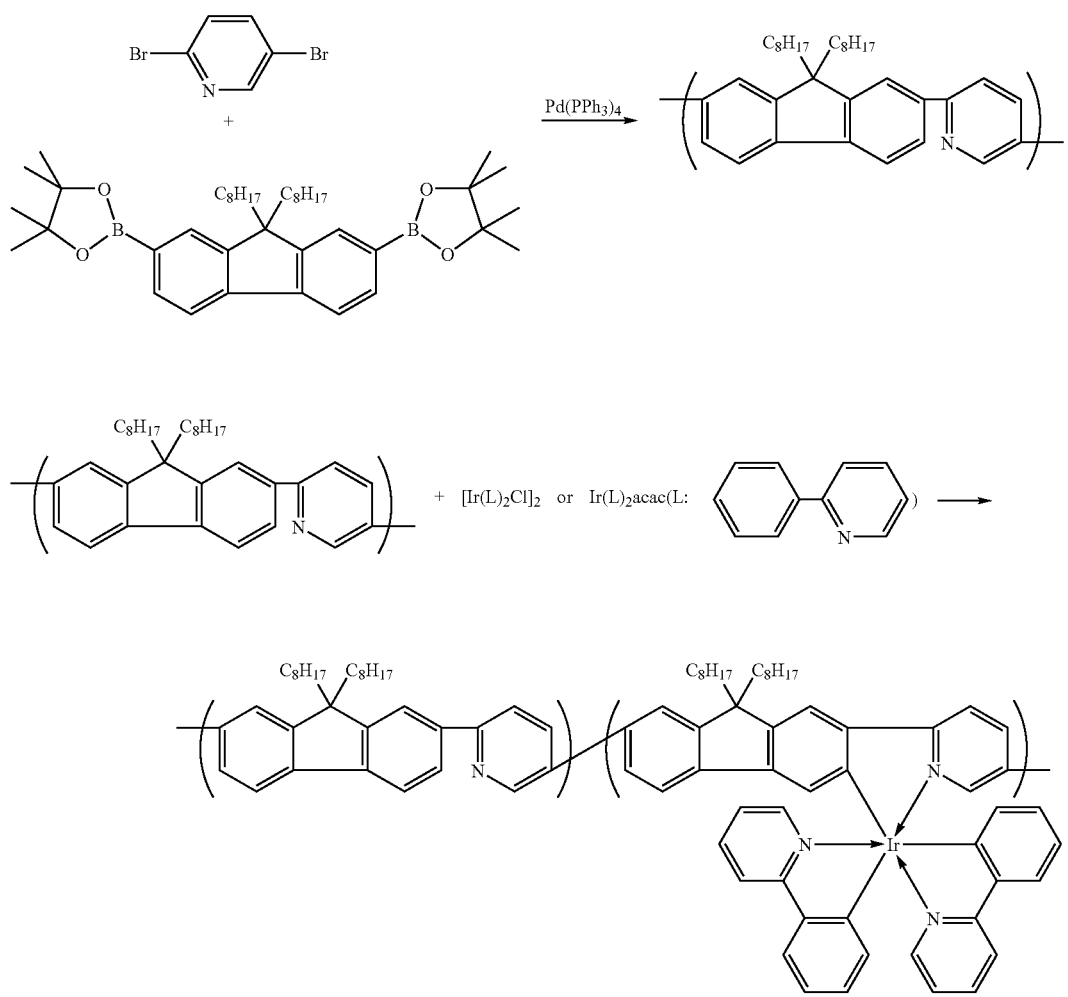

SYNTHESIS EXAMPLE 4
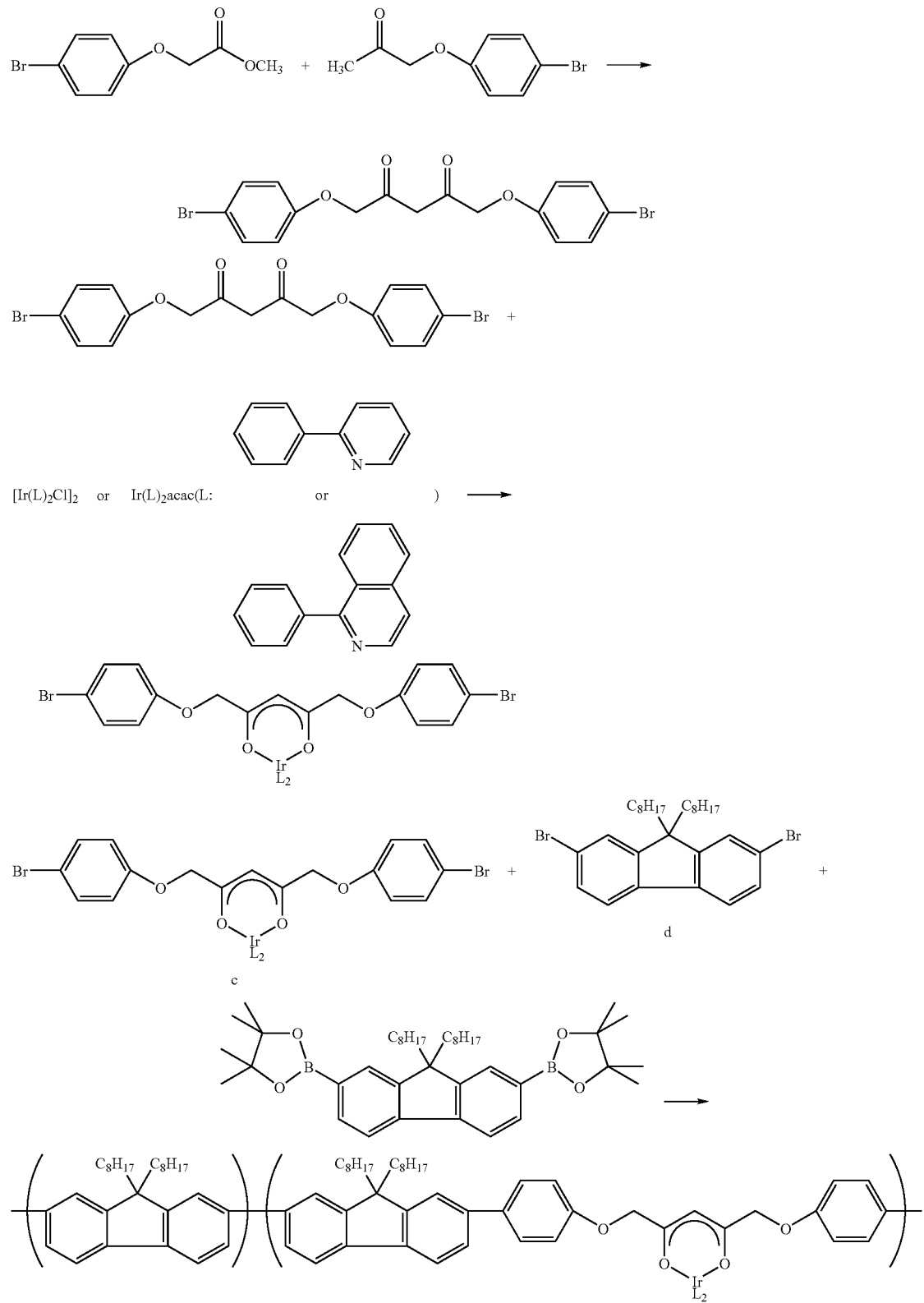

SYNTHESIS EXAMPLE 5
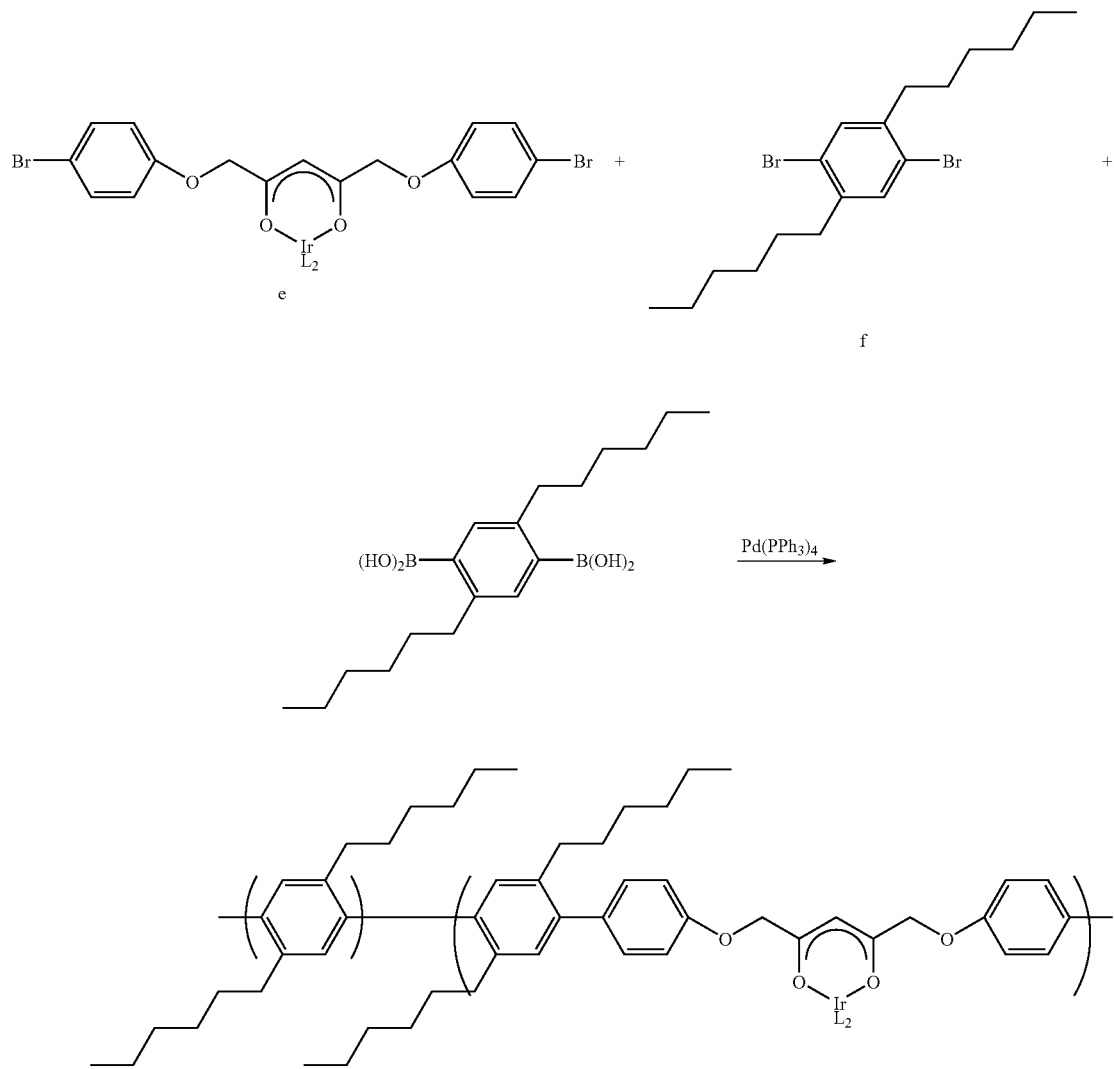
SYNTHESIS EXAMPLE 6
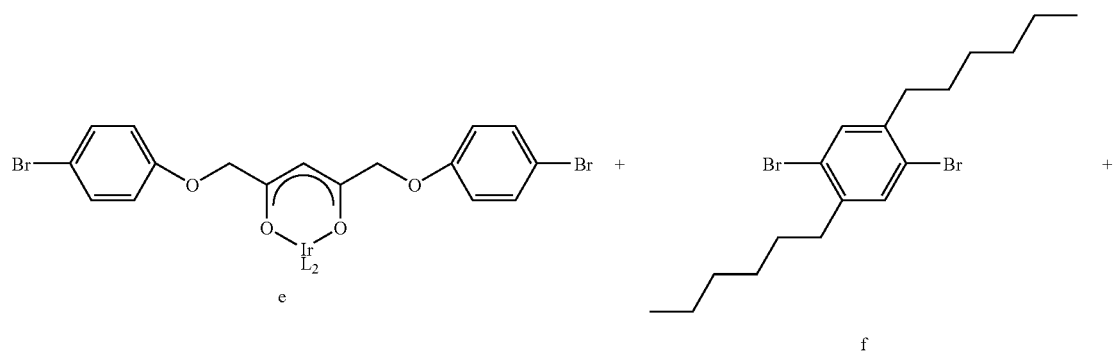

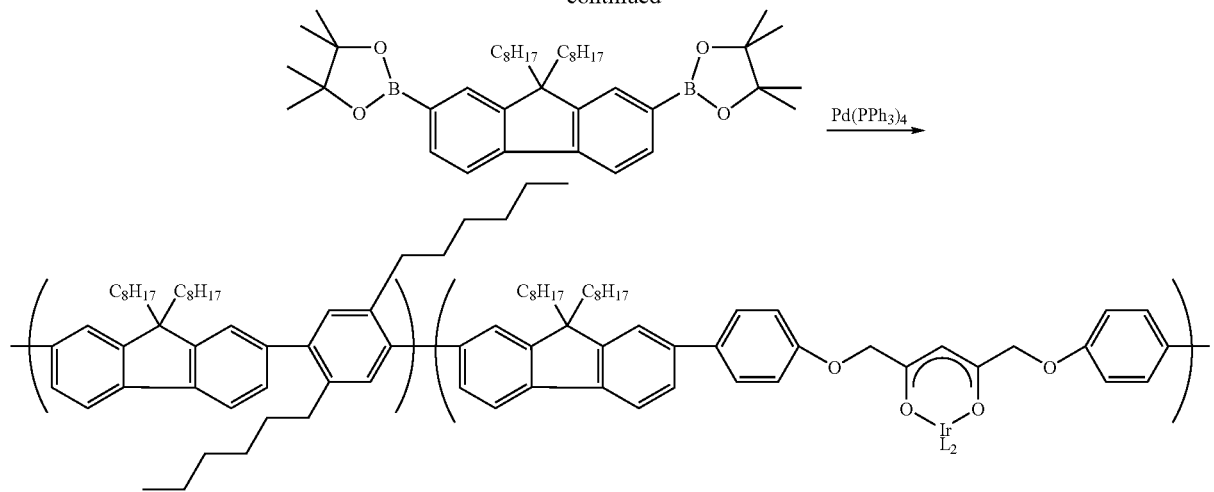

Side Chain-type Polymeric Compound

Next, specific examples of the polymeric compound having a metal complex segment directly or indirectly bonded to its polymer main chain according to the present invention are shown below.

Herein, polymeric compounds having a polymer side chain into which an iridium complex, rhodium complex or platinum complex having a ligand comprising phenyl pyridine, etc., is introduced as the metal complex segment.

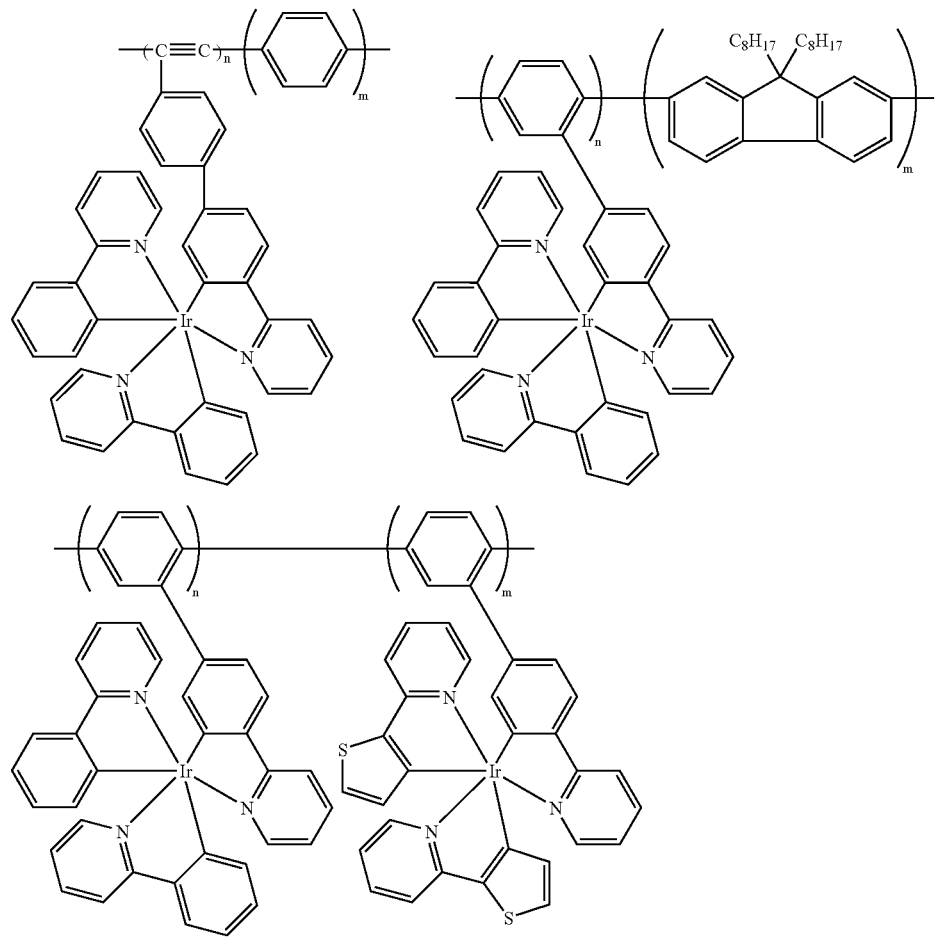

-continued
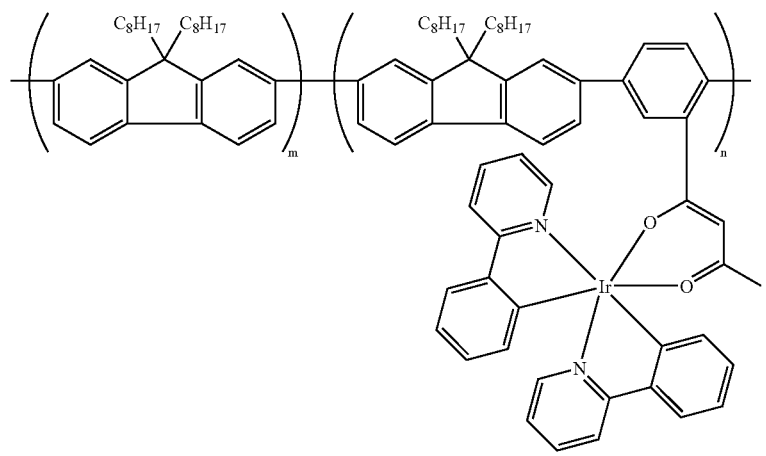
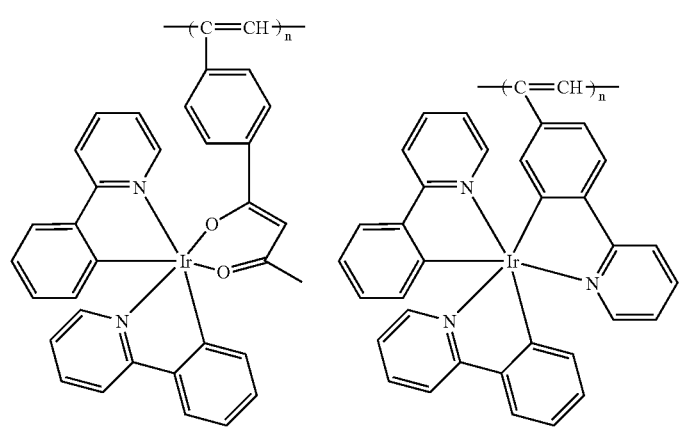
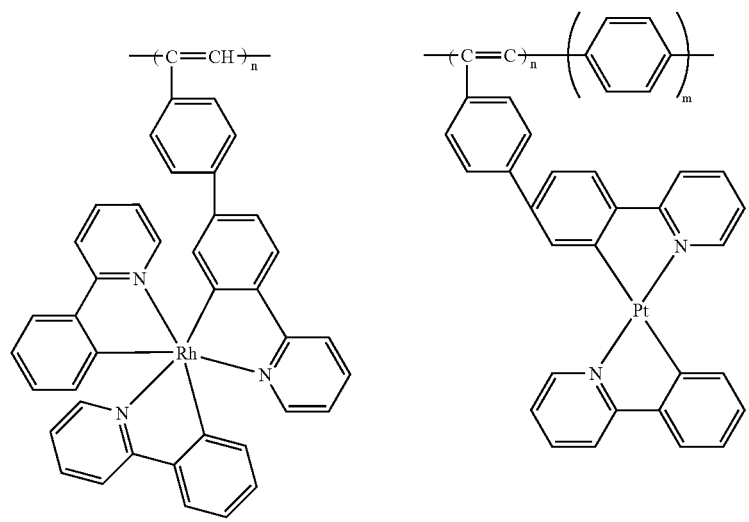

Compound examples of the polymeric compound of the present invention are shown hereinabove. Incidentally, structures of the above examples of various polymeric compounds vary depending on reaction conditions such as starting materials, concentrations and reaction temperatures, thus being not necessarily constant. Herein, representative examples are merely shown and accordingly the present invention is not restricted to these examples.

Further, even when the metal atom is platinum (Pt), rhodium (Rh), ruthenium (Ru), osmium (Os), gold (Au), palladium (Pd), copper (Cu) or cobalt (Co), a similar effect can be expected.

Further, in the organic luminescence device of the present invention, a lamination structure as shown in FIG. 1(b) principally as an organic luminescence layer is preferred but, it is possible to use the polymeric compound of the present invention and a compound having a transportability of carrier, such as electron and/or hole, formed into layers in lamination. Further, it is also possible to constitute a luminescence device by forming a single organic layer (luminescence layer) with a mixture of the polymeric compound of the present invention and a compound having a carrier transportability for an electron and/or a hole between electrodes although the structure thereof is not shown. This structure is simpler than the structure shown in FIG. 1, thus allowing an enhanced productivity of the luminescence device.

Hereinbelow, the present invention will be specifically described by enumerating Examples. In the following Examples, an iridium (Ir) complex will be principally exemplified as a metal complex for explaining the effect of the present invention.

EXAMPLE 1

Synthesis of Polymeric Compound 5

A polymeric Ir metal complex compound according to the present invention was obtained through a process shown hereinafter.

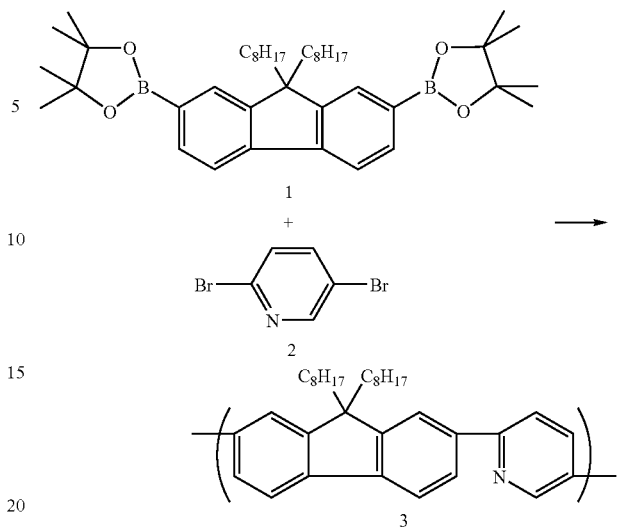

In a 20 ml-round bottomed flask (or Kjeldahl flask) aerated with nitrogen, a raw-material compound 1 (2.0 mM, 1.29 g) and a raw-material compound 2 (2.0 mM, 0.47 g) respectively sufficiently purified were placed and thereto, a mixture solution of 8 ml of tetrahydrofuran (THF) and 6 ml of 2M-$K_2CO_3$ aqueous solution was added and mixed, followed by sufficient stirring for dissolution in a nitrogen atmosphere. To the solution, Pd $(PPh_3)_4$ (17.4 mg, 0.0015 mM) was added, followed by refluxing for 48 hours. After the reaction, methanol was added to the mixture solution to precipitate a reaction product. The precipitated product was washed with water and further subjected to Soxhlet's extraction with acetone for 24 hours to obtain a yellow powdery intermediate compound 3 (0.79 g, Yield: 85%, Mn=11,000, Mw (weight-average molecular weight)/Mn 2.1 (in TFT, polystyrene standard)).

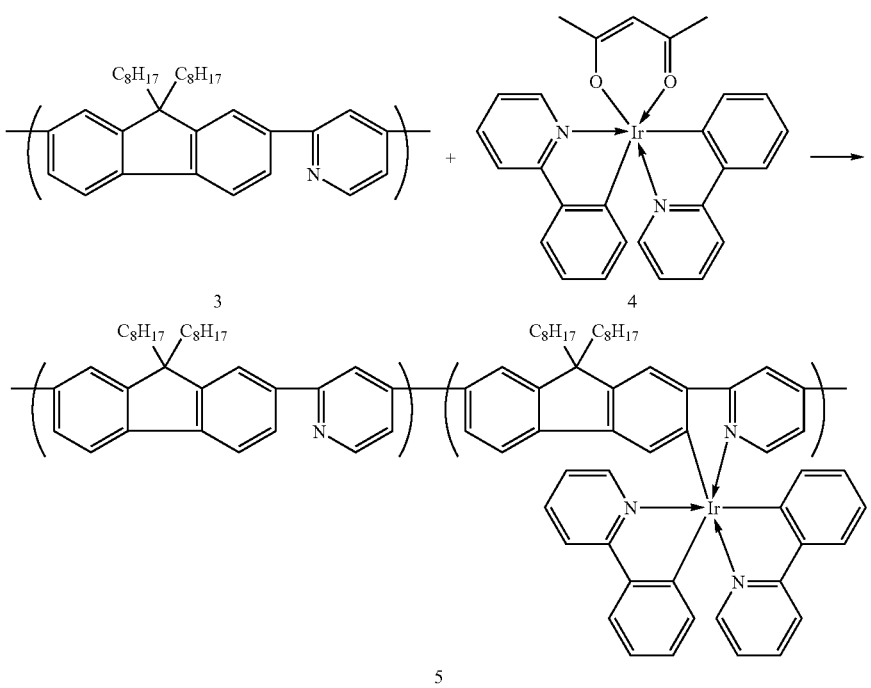

In a 100 ml-round bottomed flask, 50 ml of dehydrated glycerol was placed and aerated with nitrogen for 2 hours at 130° C. Thereafter, to the glycerol, the above-prepared compound 3 (0.47 g, 1.0 mM) and compound 4 (0.13 g, 0.2 mM) were added, followed by stirring for 18 hours under heating. The reaction product was cooled to room temperature and poured into 300 ml of 1N-HCl (hydrochloric acid). A resultant precipitate was recorded by filtration and washed with water. The precipitate was dissolved in chloroform, followed by removal of an insoluble matter by filtration. Thereafter, the resultant solution was subjected to Soxhlet's extraction with acetone for 24 hours to obtain 0.50 g of a yellow powder of an objective main chain-type polymeric compound 5 (Ir metal complex) according to the present invention (Mn=13,000, Mw/Mn=2.1 (in TFT, polystyrene standard)).

With respect to this polymeric compound, a luminescence life was examined in the following manner.

The polymeric compound was dissolved in chloroform and spin-coated onto a quartz substrate in a thickness of ca. 0.1 μm to prepare a measurement sample. The sample was exposed to pulsative nitrogen laser light at an excitation wavelength of 337 nm at room temperature by using a luminescence life meter (made by Hamamatsu Photonics K.K.). After completion of the excitation pulses, the decay time of luminescence intensity was measured.

When an initial luminescence intensity is denoted by $I_0$, a luminescence intensity after t(sec) is expressed according to the following formula with reference to a luminescence life $\tau$(sec):

$$I=I_0 \cdot \exp(-t/\tau).$$

The polymeric compound 5 showed a phosphorescent characteristic and a phosphorescence life of at most 10 μsec, thus having a shorter life among phosphorescent substances.

EXAMPLE 2

As another main chain-type polymeric compound, a polymeric compound 7 was synthesized and evaluated in the same manner as in Example 1 except that the compound 3 and the compound 4 used in Example 1 and the following compound 6 were used as starting (raw) materials and mixed in an equivalent mole ratio.

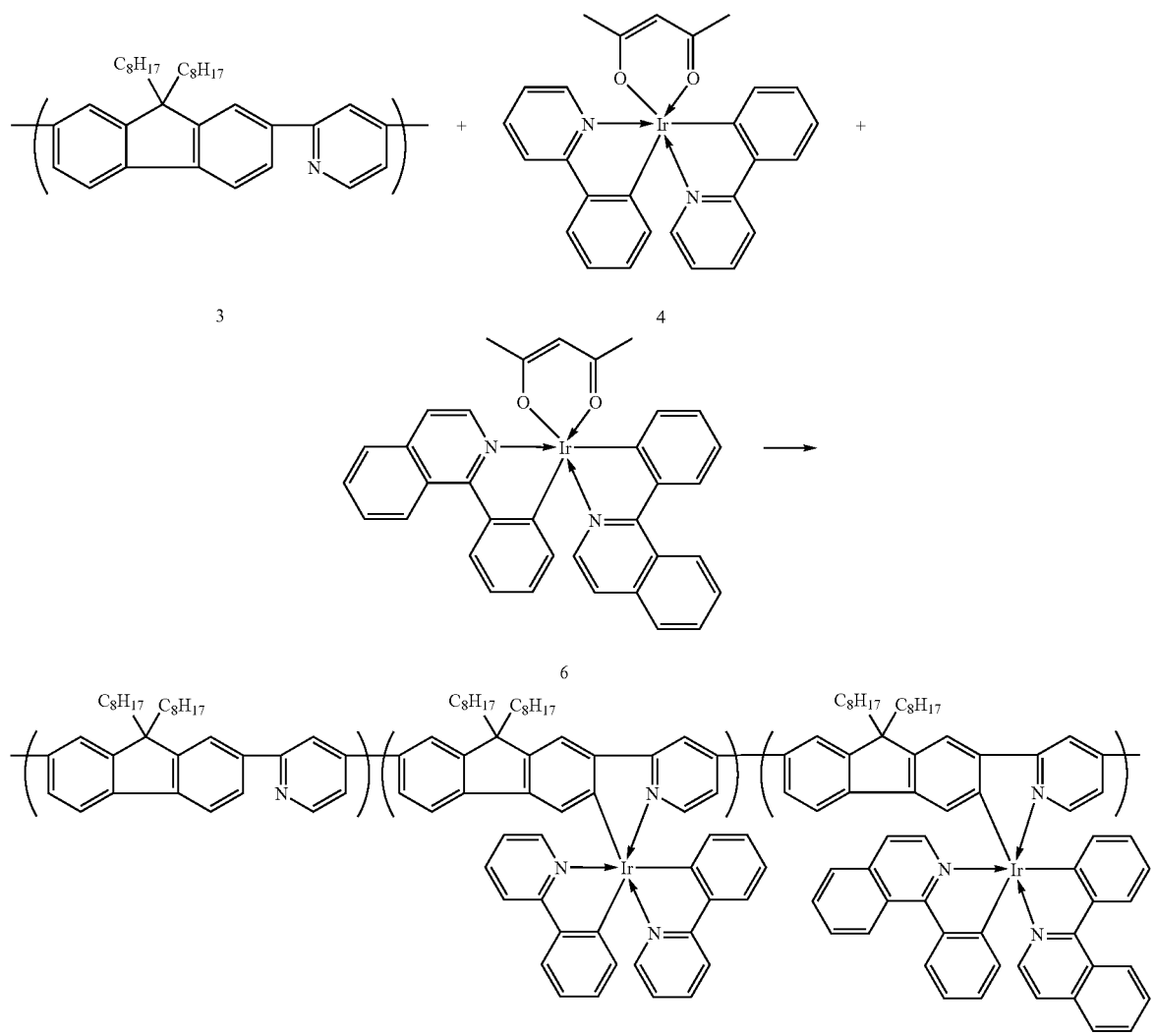

The polymeric compound 7 of this example is comprised of two species of Ir complex structures in a polymer main chain. Incidentally, an arrangement of these complex structures and a density of Ir complex are different depending on reaction conditions etc. Accordingly, the structural formula (of the polymeric compound 7) is not restricted to the above structural formula.

The polymeric compound 7 had a phosphorescent characteristic and, a phosphorescent life thereof measure according to the above-mentioned manner was 10 μsec or below, thus resulting in a shorter life among phosphorescent substances.

EXAMPLE 3

An organic luminescence device having 3 organic layers (12, 13, 16) as shown in FIG. 1(b) was prepared by using the compound obtained in the above-mentioned Example 2 and a device characteristic thereof was evaluated. First, an alkali-free glass sheet was used as a transparent substrate 15 and a 100 nm-thick indium tin oxide (ITO) film was formed thereon by sputtering and patterned as a transparent electrode 14.

On the transparent electrode 14, a polymeric film comprising PEDOT and PSS (mole ratio of 1:1) represented by the following structural formulas was formed as a hole transport layer 13 in a thickness of 40 nm (after drying) by spin coating and thereon, a 0.5%-chloroform solution of the polymeric compound 7 prepared in the above-mentioned Example 2 was spin-coated plural times an dried in an oven for 60 min. at 60° C., thus obtaining a 30 nm-thick luminescence layer 12. Further thereon, as an electron transport layer 16, a compound represented by Bphen shown below was subjected to resistance heating (vacuum) deposition at vacuum of $10^{-4}$ Pa to obtain an organic film in a thickness of 40 nm.

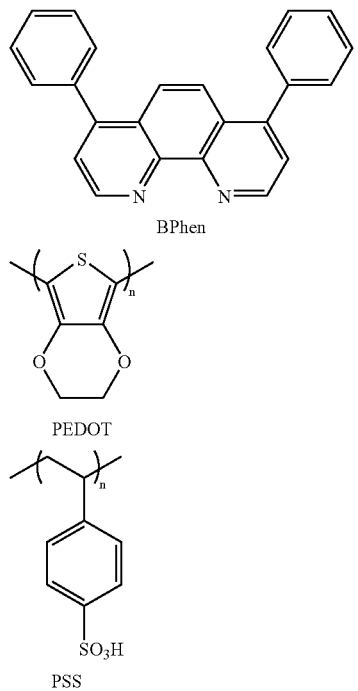

BPhen

PEDOT

PSS

On this electron transport layer 16, a layer of potassium fluoride (KF) was disposed in a thickness of 5 nm as an undercoating layer for a metal electrode layer 11.

Further, on the undercoating layer, a 100 nm-thick aluminum (Al) film was vacuum-deposited as a metal electrode 11 and patterned in a shape having an electrode area (effective display area) of 3 mm² disposed opposite to the transparent electrode 14.

The characteristics of the organic luminescence device were measured by using a micro-current meter ("4140B", made by Hewlett-Packard Corp.) for a current-voltage characteristic and "BM7" (made by Topcon K.K.) Fob an emission luminance. The device using the (polymeric) compound of this example showed a good rectification characteristic. Further, when the organic luminescence device was supplied with a voltage of 15 V (volts) between upper and lower electrodes, luminescence from the organic luminescence device was confirmed. In this Example 3, light of two emission wavelengths (550 n and 620 nm) resulting from the two species of Ir complexes which might be attributable to the compound 4 and the compound 6 was confirmed.

Next, in order to confirm that the luminescence was phosphorescence, each of the polymeric compounds prepared in Examples 1 and 2 was dissolved in chloroform, and the solution divided into two solutions, which were aerated with oxygen and nitrogen, respectively. Each of the oxygen-aerated solution and the nitrogen-aerated solution was subjected to photoirradiation for comparison of photoluminescence. As a result, substantially no luminescence attributable to the iridium complex was recognized with respect to the oxygen-aerated solution, whereas photoluminescence was confirmed with respect to the nitrogen-aerated solution. From these results, the polymeric compounds of the present invention were confirmed to be a phosphorescent polymeric compound.

Further, in contrast with a fluorescent material generally showing a luminescence life of several nsec to several tens of nsec, the polymeric compounds of the present invention all exhibited a phosporescence life of 100 nsec or longer.

EXAMPLE 4

In order to evaluate a device life, 3 types of devices were prepared in Examples 4 and 5 and Comparative Example 1 and actually driven at room temperature to measure their luminance half times (periods).

In Example 4, an organic luminescence device was prepared under the same conditions as in Example 3 except that the polymeric compound 5 prepared in Example 1 was used and the following layer structure was adopted.

Figure 3:
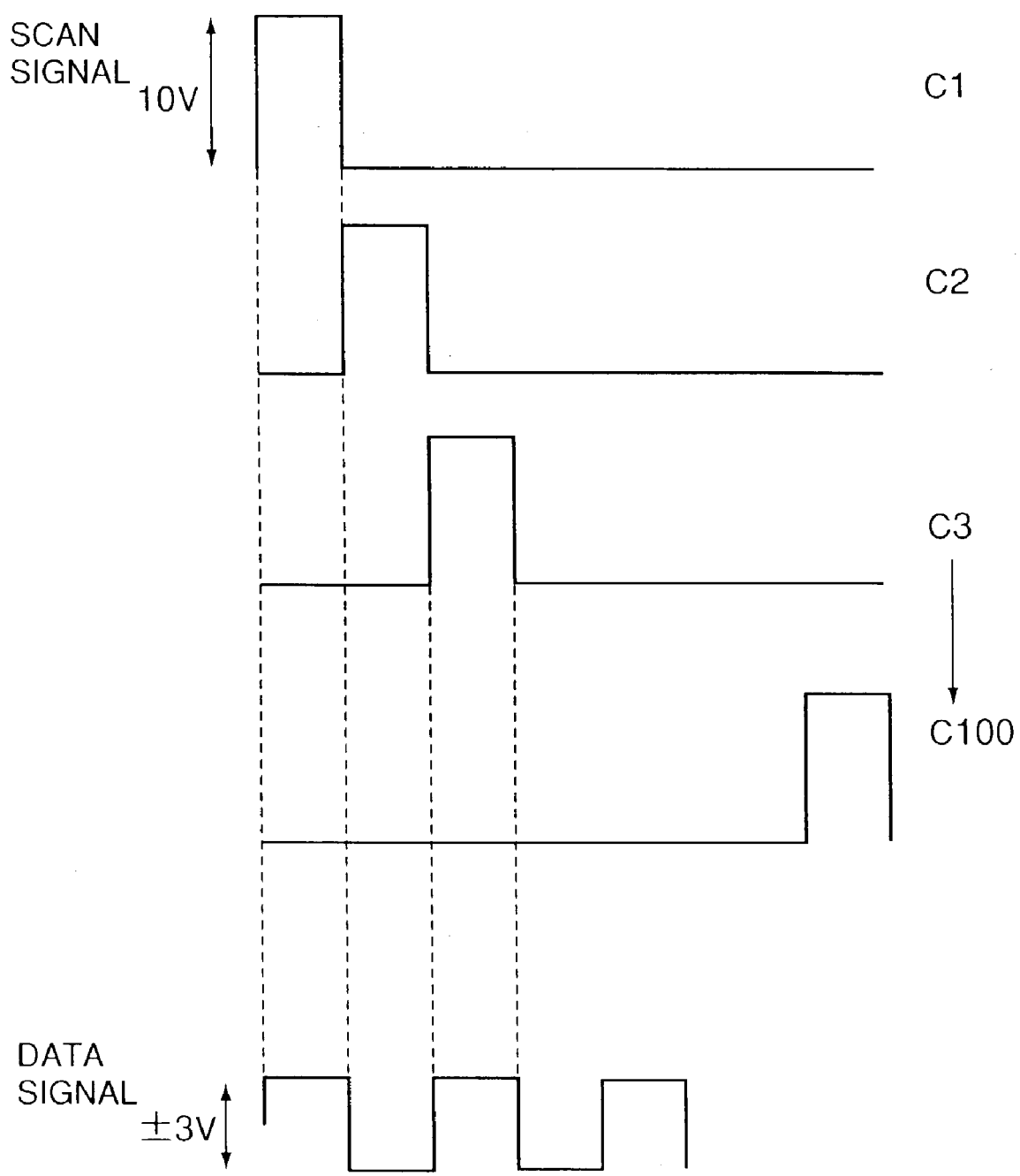
FIG. 3 is a view showing drive signal waveforms.

Hole transport layer 13 (40 nm):PEDOT:PPS (mole ratio 1:1)
Electron transport layer 16 (60 nm):Bphen To the device, a drive waveform shown in FIG. 3 was applied to measure a change in emission luminance at room temperature to determine a time of requiring a decrease of an initial luminance to ½ thereof.

EXAMPLE 5

An organic luminescence device was prepared and evaluated in the same manner as in Example 3 except that a layer of a mixture of the polymeric compound 5 prepared in Example 4 as a polymeric compound with PVK (polyvinyl carbazole) shown below as a polymeric compound containing no metal complex segment in a weight ratio of 1:10 was used as the luminescence layer.

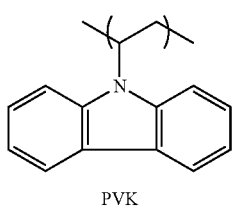

PVK

COMPARATIVE EXAMPLE 1

An organic luminescence device was prepared and evaluated in the same manner as in Example 3 except that the luminescence layer was formed by using a film of a mixture prepared by dispersing an iridium-ppy complex (Ir(ppy)$_3$) in the above-mentioned polymeric compound 3 having no metal complex segment in a weight ratio of 1:10, as the luminescent material.

The results of Example 4, Example 5 and Comparative Example 1 are shown inclusively in Table 1.

As a result of a current-passing durability test of the devices using the respective polymeric compounds, it has been found that the devices using the polymeric compounds of the present invention clearly exhibited longer luminance half times than the device using the conventional luminescent material, thus allowing a device having a high durability attributable to stability of the luminescent materials of the present invention.

TABLE 1

|  | Luminescent material for luminescence layer | Luminescence half time (hours) |
| --- | --- | --- |
| Example 4 | Polymeric compound 5 | 700 |
| Example 5 | Mixture of polymeric compound 5 with PVK (1:10) | 650 |
| Comparative Example 1 | Ir(ppy)$_3$ with polymeric compound 3 (1:10) | 350 |

EXAMPLE 6

A polymeric compound 9 having an iridium complex in a polymer side chain was obtained through the following reaction.

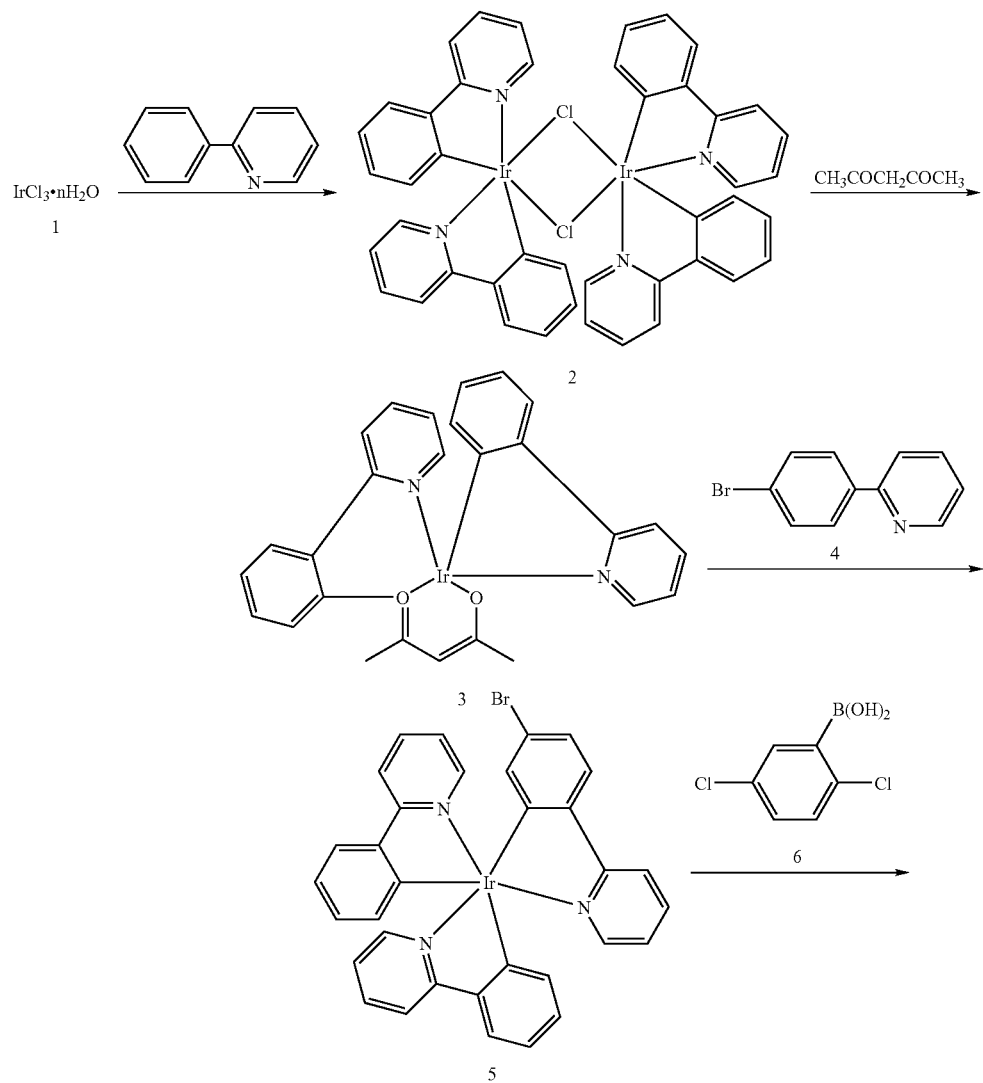

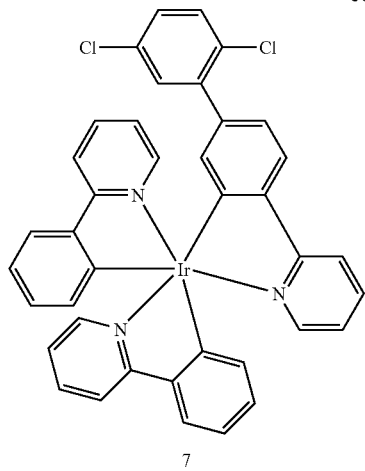

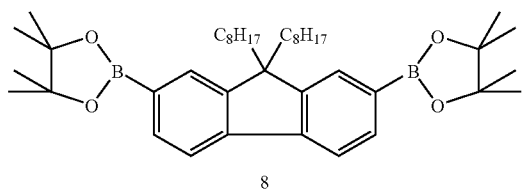

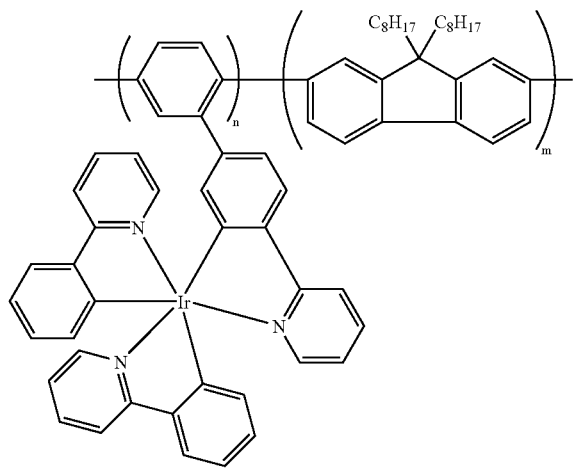

Synthesis of Compound 2 and Compound 3

Compound 2 and Compound 3 as intermediates of an iridium complex were synthesized by using an iridium chloride and phenyl pyrimidine as raw (starting) materials with reference to Sergey Lamansky et al., "Inorg. Chem.", 40, pp. 1704-(2002).

Synthesis of Compound 5

In a 100 ml-round bottomed flask, 50 ml of dehydrated glycerol was placed and nitrogen-aerated for 2 hours at 130° C. Thereafter Compound 3 (1.2 g, 2 mM) and Compound 4 (1.2 g, 2.5 mM) were added to the glycerol, followed by stirring under heating in a nitrogen stream for 18 hours. The reaction product was cooled to room temperature and poured into 600 ml of 1N-hydrochloric acid to recover a precipitate by filtration, followed by washing with water. Thereafter, the precipitate was purified by preparation HPLC (high performance liquid chromatography) to obtain 300 mg of a powdery six-coordinate iridium compound 5.

Synthesis of Compound 7

In a 20 ml-round bottomed flask aerated with nitrogen, Compound 5 (300 mg, 0.22 mM) and Compound 6 (42 mg, 0.22 mM) were placed and thereto, 2 ml of toluene, 1 ml of ethanol and 2 ml of 2M-$K_2CO_3$ aqueous solution were added for mixing, followed by sufficient stirring in a nitrogen atmosphere. Thereafter, 40 mg (0.035 mM) of $Pd(PPh_3)_4$ was added to the mixture, followed by refluxing for 8 hours. After the reaction, the mixture was subjected to extraction by addition of toluene and water and the organic layer was dried with magnesium sulfate, followed by purification by alumina chromatography to obtain 150 mg of powdery Compound 7.

Synthesis of Polymeric Compound 9

In a 20 ml-round bottomed flask aerated with nitrogen, 150 mg (0.2 mM) of sufficiently purified Compound 7 and 129 mg (0.2 mM) of a polymeric monomer 8 were placed and thereto, 1 ml of tetrahydrofuran (THF) and 0.6 ml of 2M-$K_2CO_3$ aqueous solution were added for mixing. After the mixture was sufficiently stirred in a nitrogen atmosphere, 1.73 mg (0.00015 mM) of $Pd(PPh_3)_4$ was added to the mixture, followed by refluxing for 48 hours. After the reaction, the mixture liquid was reprecipitated in methanol and washed with water, followed by Soxhlet's extraction with acetone for 24 hours to obtain 195 mg of powdery side chain-type polymeric compound 9 of the present invention.

Discrimination between fluorescence and phosphorescence with respect to a luminescence was performed in the same manner as in Example 3 by using the above-prepared polymeric compound 9. As a result, substantially no luminescence attributable to the iridium complex was recognized with respect to the oxygen-aerated solution, whereas photoluminescence was confirmed with respect to the nitrogen-aerated solution. From these results, the polymeric compound 9 of the present invention was confirmed to exhibit a phosphorescent characteristic.

The polymeric compound 9 had a phosphorescent life, as a result of measurement according to the above-mentioned manner was 10 µsec or below, thus resulting in a shorter life among phosphorescent substances.

EXAMPLE 7

An organic luminescence device having 3 organic layers as shown in FIG. 1(b) was prepared by using the polymeric compound 9 obtained in Example 1 and a device characteristic thereof was evaluated. An alkali-free glass sheet was used as a transparent substrate 15 and a 100 nm-thick indium tin oxide (ITO) film was formed thereon by sputtering and patterned as a transparent electrode 14. On the transparent electrode 14, a polymeric film comprising PEDOT and PSS (mole ratio of 1:1) represented by the following structural formulas was formed as a hole transport layer 13 in a thickness of 40 nm by spin coating and thereon, a 0.5%-chloroform solution of the polymeric compound 9 prepared in Example 1 was spin-coated plural times an dried in an oven for 60 min. at 60° C., thus obtaining a 30 nm-thick luminescence layer 12. Further thereon, as an electron transport layer 16, a compound represented by Bphen shown below was subjected to resistance heating (vacuum) deposition at a vacuum of $10^{-4}$ Pa to obtain an organic film in a thickness of 40 nm.

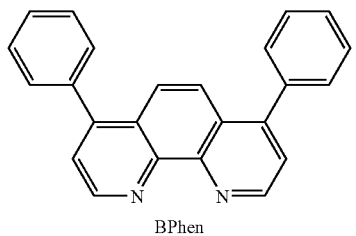

BPhen

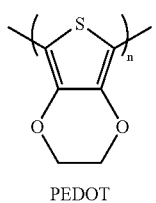

PEDOT

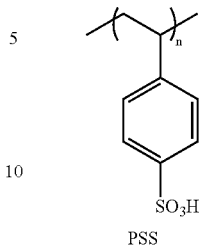

PSS

On this electron transport layer 16, a layer of potassium fluoride (KF) was disposed in a thickness of 5 nm as an undercoating layer for a metal electrode layer 11.

Further, on the undercoating layer, a 100 nm-thick aluminum (Al) film was vacuum-deposited as a metal electrode 11 and patterned in a shape having an electrode area (effective display area) of 3 mm$^2$ disposed opposite to the transparent electrode 14.

The characteristics of the organic luminescence device were measured by using a micro-current meter ("4140B", made by Hewlett-Packard Corp.) For a current-voltage characteristic and "BM7" (made by Topcon K.K.) For an emission luminance. The device using the (polymeric) compound of this example showed a good rectification characteristic. Further, when the organic luminescence device was supplied with a voltage of 15 V (volts) between upper and lower electrodes, luminescence from the organic luminescence device was confirmed. Further, this luminescence was similar to photoluminescence of the luminescent material used in this example measured in a toluene solution, so that it was confirmed that the luminescence was that emitted from the luminescence material being the iridium complex.

Further, when the luminescence characteristic of the organic luminescence device of this example was measured, in contrast with a fluorescent material generally showing a luminescence life of several nsec to several tens of nsec, the device exhibited a phosporescence life of 2 µsec or shorter.

EXAMPLE 8

Compound 10 was synthesized in the same synthesis process as in Example 6, and a side chain-type polymeric compound 11 of the present invention was synthesized in the following process.

In a 20 ml-round bottomed flask aerated with nitrogen, 75 mg (0.1 mM) of sufficiently purified Compound 7 and 81 mg (0.1 mM) of Compound 10 and 129 mg (0.2 mM) of Compound 8 were placed and thereto, 1 ml of tetrahydrofuran (THF) and 0.6 ml of 2M-K$_2$CO$_3$ aqueous solution were added for mixing. After the mixture was sufficiently stirred in a nitrogen atmosphere, 1.73 mg (0.00015 mM) of Pd(PPh$_3$)$_4$ was added to the mixture, followed by refluxing for 48 hours. After the reaction, the mixture liquid was reprecipitated in methanol and washed with water, followed by Soxhlet's extraction with acetone for 24 hours to obtain 120 mg of powdery polymeric compound 11 of the present invention.

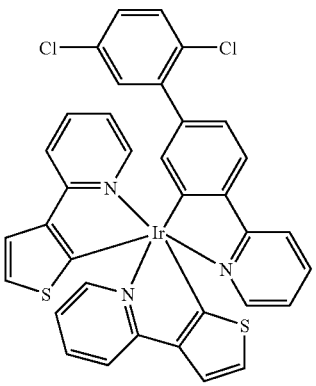

10

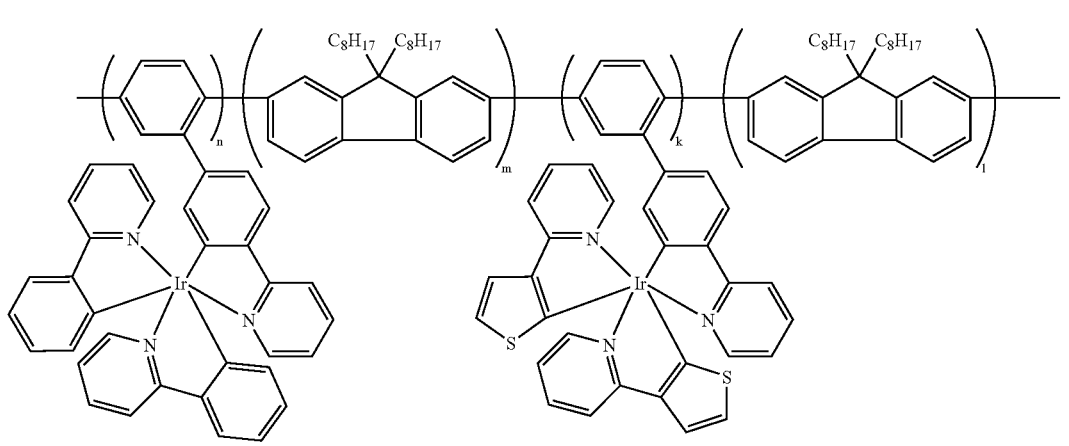

11

This luminescence was also similar to photoluminescence of the resultant polymeric compound 11 measured in its toluene solution, so that it was confirmed that the luminescence was that emitted from this luminescence material.

The characteristics of the organic luminescence device were measured at room temperature by using a microcurrent meter ("4140B", made by Hewlett-Packard Corp.) For a current-voltage characteristic and "BM7" (made by Topcon K.K.) Fob an emission luminance. The device using the polymeric compound 11 of this example showed a good rectification characteristic. Further, when the organic luminescence device was supplied with a voltage of 15 V (volts) between upper and lower electrodes, luminescence from the organic luminescence device was confirmed at a practical operation temperature range (−20 C. to 60° C). In this Example 8, luminescence of (two) broad peaks (530 n and 550 nm) resulting from the two species of Ir complexes which might be attributable to the compound 4 and the compound 6 was confirmed.

EXAMPLE 9

An organic luminescence device was prepared and evaluated in the same manner as in Example 7 except that a mixture obtained by mixing the polymeric compound 11 synthesized in Example 8 with PVK (polyvinyl carbazole) in a weight ratio of 1:10.

The resultant luminescence device showed a good rectification characteristic and, luminescence from the luminescence device was confirmed when a voltage of 13 V (volts) was applied to the device. Further, the luminescence was similar to photoluminescence of the luminescent material used in this example measured in a toluene solution, so that it was confirmed that the luminescence was that emitted from the polymeric compound 11 (iridium complex).

EXAMPLE 10

Luminance half times were measured in the same manner as in Example 4 except for using the luminescence devices of Example 7 and Example 9. The results are shown in Table 2 hereinafter.

COMPARATIVE EXAMPLE 2

An organic luminescence device was prepared and evaluated in the same manner as in Example 7 except that a mixture prepared by mixing the above-mentioned Ir(ppy)$_3$ in the following polymeric compound 12 having no metal complex segment synthesized in the same manner as in Example 1 in a weight ratio of 1:10, as the luminescent material for the luminescence layer 12. The results are shown in Table 2.

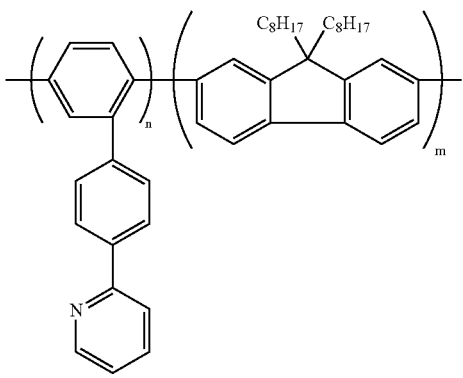

It has been found that the devices using the polymeric compounds of the present invention clearly exhibited longer luminance half times than the device using the conventional luminescent material, thus allowing a device having a high durability attributable to stability of the luminescent materials of the present invention.

TABLE 2

|  | Luminescent material for luminescence layer | Luminescence half time (hours) |
| --- | --- | --- |
| Device of Example 7 | Polymeric compound 9 | 600 |
| Device of Example 9 | Mixture of polymeric compound 11 with PVK (1:10) | 650 |
| Device of Comparative Example 2 | Mixture of Ir(ppy)$_3$ with polymeric compound 12 (1:10) | 350 |

EXAMPLE 11

Figure 2:
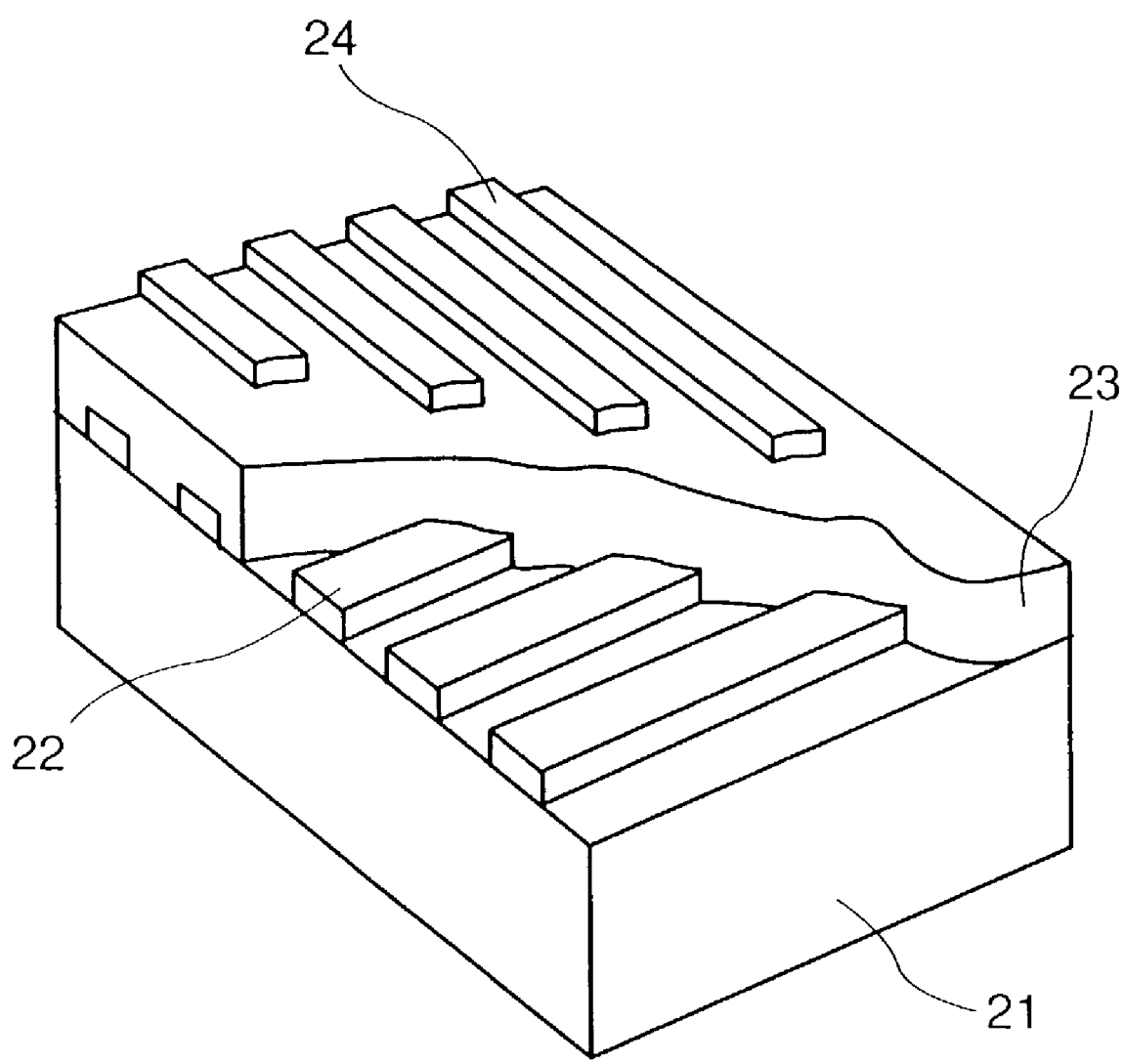
FIG. 2 is a perspective view showing an XY matrix-type organic EL device.

Hereinbelow, two examples of display apparatus are described. First, an example of preparation of a picture (image) display apparatus having an XY (simple)-matrix wiring (structure) is shown in FIG. 2.

On a glass substrate 21 measuring 150 mm-length (vertical), 150 mm-width (horizontal) and 1.1 mm-thickness, a ca. 100 nm-thick ITO film was formed by sputtering and patterned into 100 lines of 100 μm-wide transparent matrix electrodes (anode side) with a spacing of 40 μm as simple matrix electrodes 22. Then, a three-layered organic compound layer 23 was formed thereon under the same conditions as in Example 3.

Then, 100 lines of 100 μm-wide metal electrodes 24 were formed with a spacing of 40 μm by mask vacuum deposition so as to be perpendicular to the transparent electrodes by vacuum deposition at a vacuum of $2 \times 10^{-5}$ Torr. The metal electrodes were formed of Al in a thickness of 150 nm after forming a 5 nm-thick KF film as an undercoating layer. The thus-obtained 100×100-simple matrix-type organic EL device was subjected to a simple matrix drive in a glove box filled with nitrogen at voltages of 7 volts to 13 volts by using a scanning signal of 10 volts and data signals of ±3 volts as shown in FIG. 3. As a result of an interlaced drive at a frame frequency of 30 Hz, white/black binary pictures (images) were confirmed.

As a picture display apparatus, the high-efficiency luminescence device of the present invention allows a light-weight flat panel display with economized energy consumption and high-recognizability. As a printer light source, the luminescence devices of the present invention may be arranged in a line and disposed in proximity to the photosensitive drum, to be utilized as a line shutter wherein the respective devices are driven independently from each other to effect desired exposure on the photosensitive drum. On the other hand, the energy consumption economization effect can be expected in application as an illumination device or a backlight for a liquid crystal display apparatus.

For another application to a picture display device, it is particularly advantageous to form an active matrix-type picture display device (panel) equipped with thin film transistors (TFTs) instead of the above-mentioned XY-matrix wiring.

Figure 4:
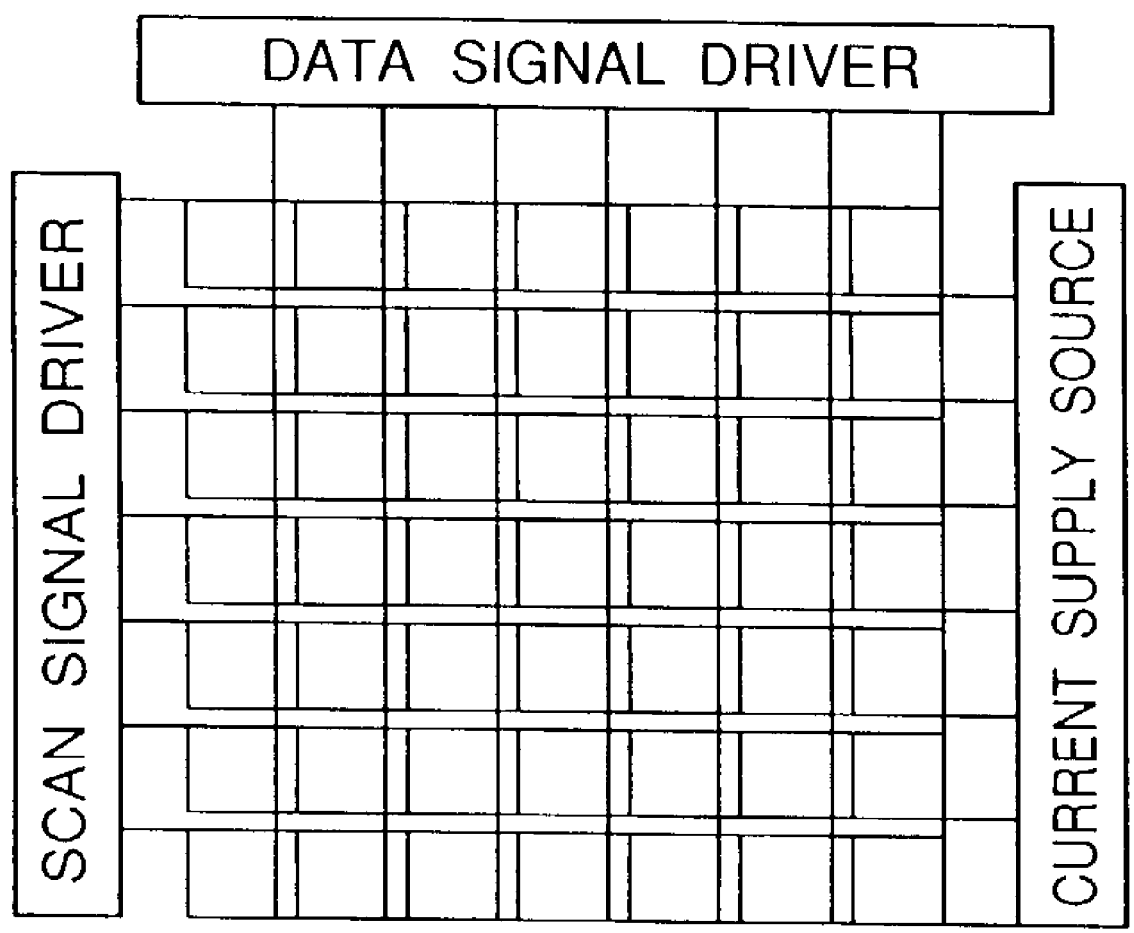
FIG. 4 is an explanatory view of a matrix-type organic EL device using TFTS.

FIG. 4 is a schematic plan view of the above-mentioned panel. Circumferentially outside the panel are disposed a drive circuit comprising a scanning signal driver and a current supply source, and a data signal driver as a display signal input means (called a picture data supply means), which are respectively connected to X-direction scanning lines called gate lines and Y-direction lines called data lines, and current supply lines. The scanning signal driver sequentially selects the gate scanning lines, and in synchronism therewith, picture signals are supplied from the data signal driver. Display pixel electrodes are disposed at intersections of the gate scanning lines and the data lines.

The active device used in the present invention need not be particularly restricted, and can also be a single-crystal silicon TFT, an amorphous silicon (a-Si) TFT, etc.

On the above-mentioned pixel electrodes, multiple layers or a single layer of organic luminescence layer may be formed and metal electrodes as cathode are sequentially laminated to provide an active-type organic luminescence display device.

INDUSTRIAL APPLICABILITY

As described above, according to the present invention, it is possible to a novel main chain-type or side chain-type polymeric compound showing a phosphorescent characteristic. By using this polymeric compound in a luminescence layer, it is possible to obtain an organic luminescence device less causing a concentration extinction (deactivation) while having a high luminescence efficiency. It is also effective in prolonging the life of the device. Further, in combination with an active element particularly using a thin film transistor (TFT), it becomes possible to provide good halftones and stable display even in a long-period display.

The invention claimed is:

1. An organic luminescence device, comprising:
at least a pair of electrodes disposed on a substrate and an organic layer disposed therebetween comprising at least a side chain-type polymeric compound, wherein said side chain-type polymeric compound comprises a conjugated chain as a main chain and at least a metal complex segment in a side chain, wherein the metal complex segment has a plurality of ligands one of which is directly bonded to the main chain via a covalent bond so as to continue conjugation to the metal.

2. An organic luminescence device according to claim 1, wherein the metal complex segment has a center metal selected from the group consisting of platinum (Pt), rhodium (Rh), ruthenium (Ru), iridium (Ir), osmium (Os), gold (Au), palladium (Pd), copper (Cu) and cobalt (Co).

3. An organic luminescence device according to claim 1, wherein the organic layer is at least a luminescence layer comprising at least the side chain-type polymeric compound and a carrier transporting material.

4. An organic luminescence device according to claim 1, wherein the side chain-type polymeric compound is a copolymer.

5. An organic luminescence device according to claim 1, wherein the organic layer is at least a luminescence layer which emits phosphorescence.

6. An organic luminescence layer according to claim 1, wherein the side chain-type polymeric compound comprises a plurality of metal complexes having mutually different structures.

7. An organic luminescence device, comprising: at least a pair of electrodes disposed on a substrate and an organic layer disposed between the pair of electrodes;

wherein the organic layer comprises a side chain-type polymeric compound represented by the following formula:

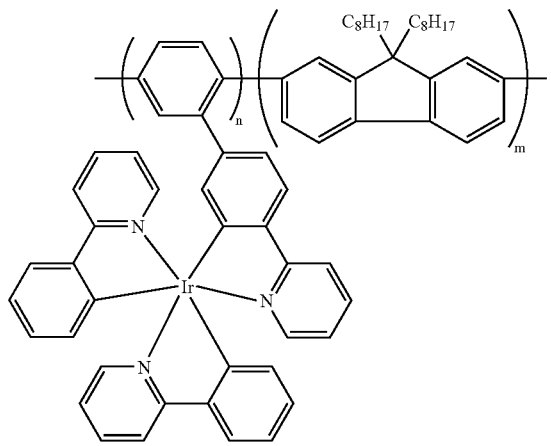

wherein m and n each represent degree of polymerization, n is not 0 and m and n provide the repeating units in the polymeric compound.

* * * * *